United States Patent
Takahashi et al.

(10) Patent No.: US 9,337,803 B2
(45) Date of Patent: May 10, 2016

(54) PIEZOELECTRIC DEVICE AND ELECTRONIC APPARATUS

(71) Applicant: Sony Corporation, Tokyo (JP)

(72) Inventors: Kazuo Takahashi, Kanagawa (JP); Satoshi Mitani, Kanagawa (JP); Hidetoshi Kabasawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 110 days.

(21) Appl. No.: 14/293,630

(22) Filed: Jun. 2, 2014

(65) Prior Publication Data

US 2014/0368088 A1    Dec. 18, 2014

(30) Foreign Application Priority Data

Jun. 12, 2013  (JP) ................... 2013-123355

(51) Int. Cl.
  *H03H 9/21*       (2006.01)
  *G01C 19/5607*    (2012.01)
  *H03H 9/24*       (2006.01)
  *H03H 9/02*       (2006.01)

(52) U.S. Cl.
  CPC ............. *H03H 9/21* (2013.01); *G01C 19/5607* (2013.01); *H03H 9/02259* (2013.01); *H03H 9/2484* (2013.01); *H03H 9/2489* (2013.01)

(58) Field of Classification Search
  CPC ....... H03H 9/21; H03H 9/215; H03H 9/2468; H03H 9/2473; H03H 9/2484; H03H 9/2494; H03H 3/04; H03H 2003/026; H03H 2003/0492; G01C 19/5607
  USPC .......................... 310/370; 331/156; 73/504.12
  See application file for complete search history.

(56) References Cited

U.S. PATENT DOCUMENTS

| | | | | |
|---|---|---|---|---|
| 4,178,566 A | * | 12/1979 | Kawashima ............ | G04F 5/063 310/361 |
| 4,507,970 A | * | 4/1985 | Dinger .................. | G01L 9/0022 310/312 |
| 2008/0115580 A1 | * | 5/2008 | Murakami ............ | G01P 15/097 73/504.16 |
| 2009/0160581 A1 | * | 6/2009 | Hagelin ............... | H03H 9/2468 333/200 |
| 2011/0296914 A1 | | 12/2011 | Takahashi et al. | |
| 2013/0239681 A1 | * | 9/2013 | Fujii .................. | G01C 19/5719 73/504.12 |
| 2013/0320816 A1 | * | 12/2013 | Yamaguchi ........... | H01L 41/332 310/367 |

FOREIGN PATENT DOCUMENTS

JP    4858662    1/2012

* cited by examiner

*Primary Examiner* — J. San Martin
(74) *Attorney, Agent, or Firm* — K&L Gates LLP

(57) ABSTRACT

A piezoelectric device includes a vibrator, a piezoelectric drive unit, and a first piezoelectric detector. The vibrator includes a first surface, a first groove formed along a first axis direction, and a second groove formed to be parallel to the first groove. The piezoelectric drive unit includes a first electrode pair provided in the first groove and opposed to each other in a second axis direction orthogonal to the first axis direction and parallel to the first surface, and a first piezoelectric body provided between the first electrode pair, and is capable of vibrating the vibrator. The first piezoelectric detector includes a second electrode pair provided in the second groove and opposed to each other in the second axis direction, and a second piezoelectric body provided between the second electrode pair, and is capable of detecting a vibration of the vibrator.

13 Claims, 26 Drawing Sheets

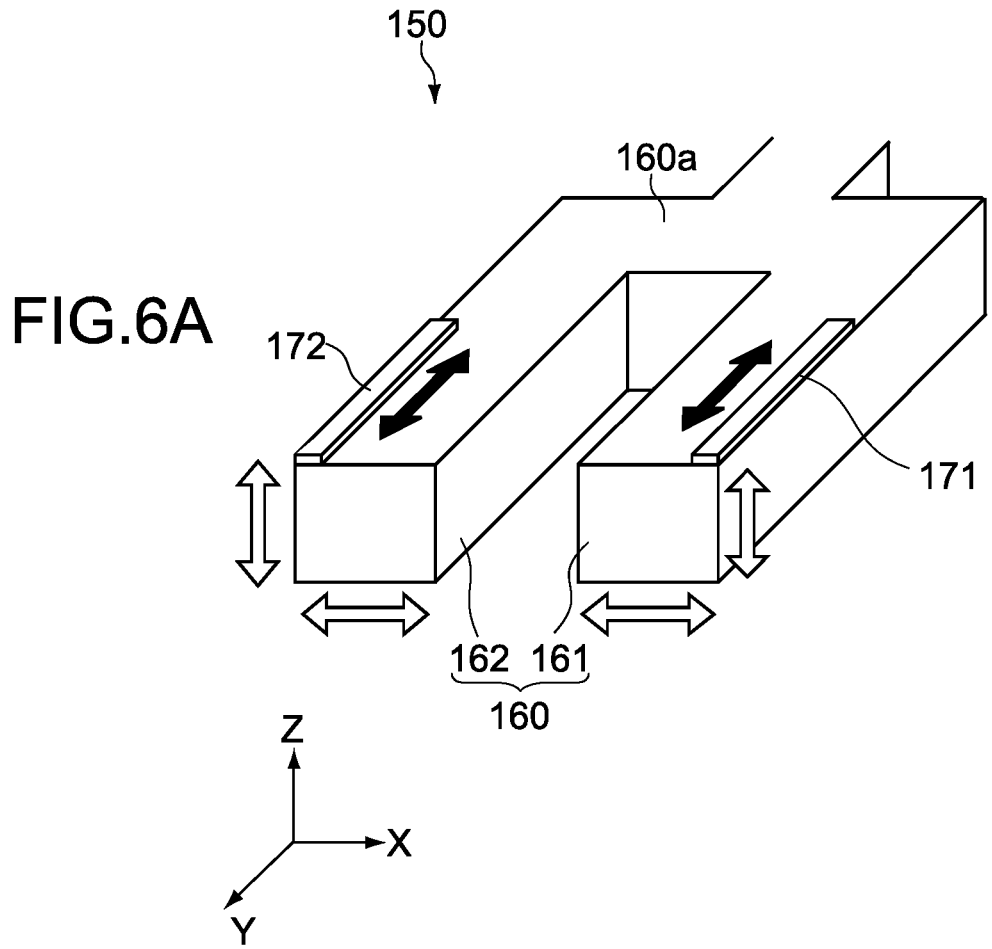
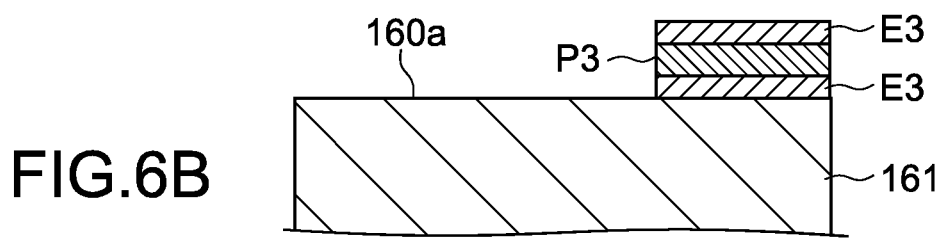

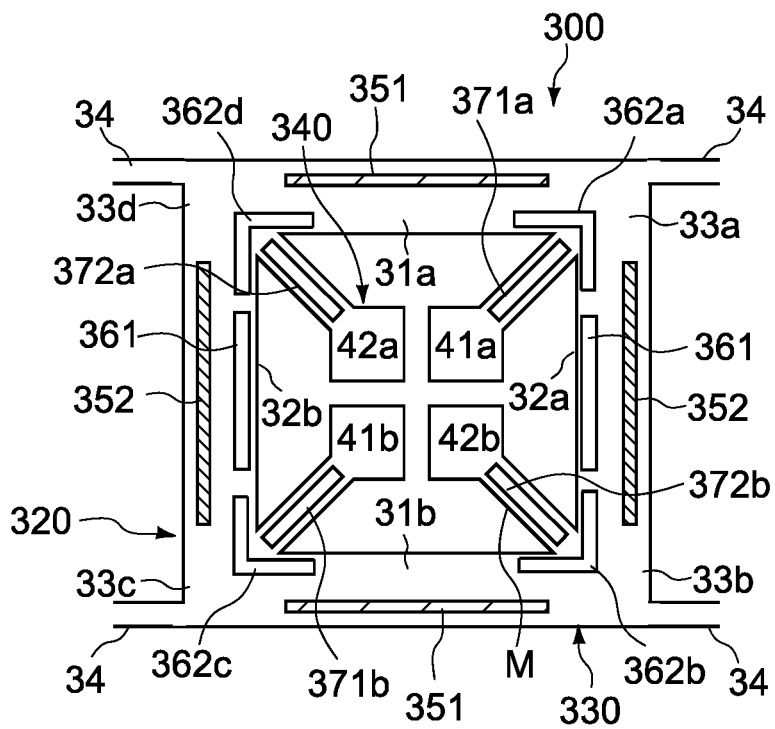
FIG.10
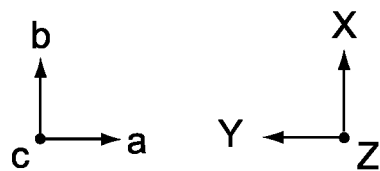
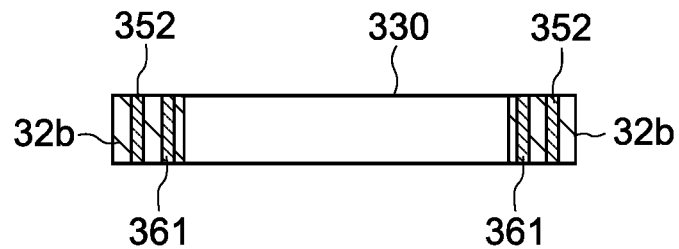
FIG.11
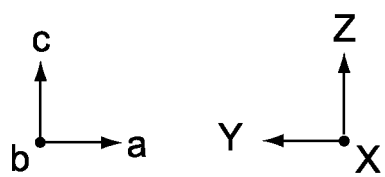

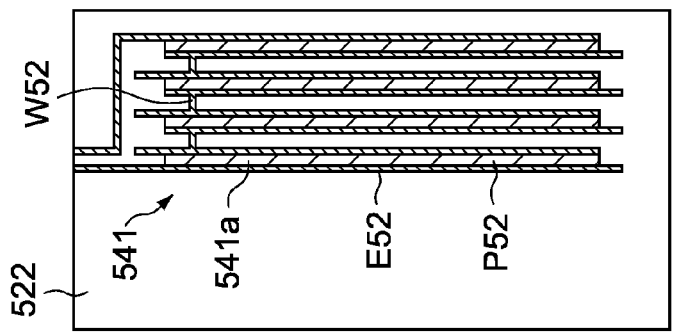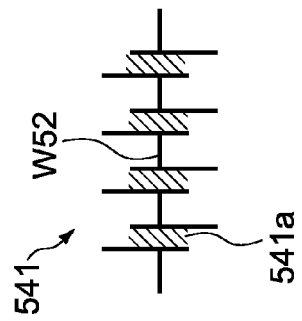
FIG.19C
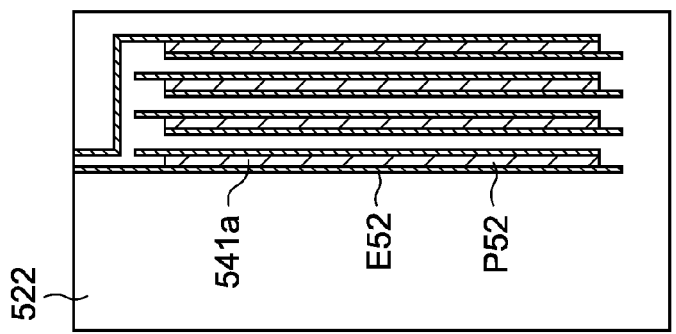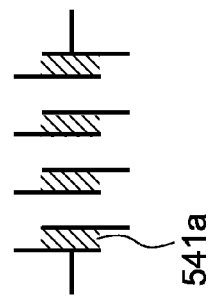
FIG.19B
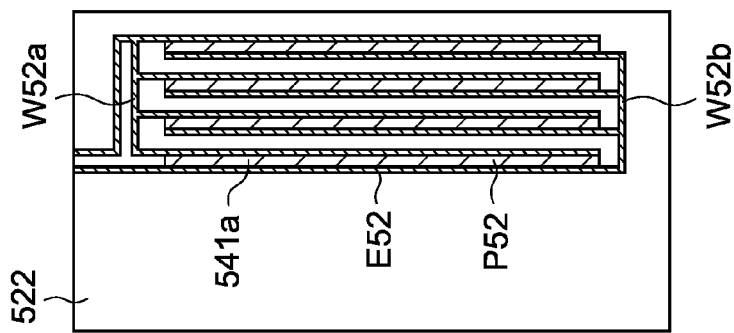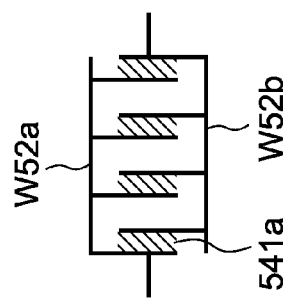
FIG.19A

PIEZOELECTRIC DEVICE AND ELECTRONIC APPARATUS

CROSS REFERENCES TO RELATED APPLICATIONS

The present application claims priority to Japanese Priority Patent Application JP 2013-123355 filed in the Japan Patent Office on Jun. 12, 2013, the entire content of which is hereby incorporated by reference.

BACKGROUND

The present disclosure relates to, a piezoelectric device applied to, for example, an oscillation device or a vibration gyro sensor and to an electronic apparatus including the same.

As consumer angular velocity sensors, vibration gyro sensors are widely used. The vibration gyro sensor detects an angular velocity in such a manner that the vibrator is vibrated at a predetermined frequency and a Coriolis force generated in the vibrator is detected by a piezoelectric element or the like. The gyro sensor is, for example, installed into an electronic apparatus such as a video camera, a virtual reality apparatus, and a car navigation system, which are utilized as, for example, sensors for shake detection, motion detection, and direction detection, respectively.

For example, Japanese Patent No. 4858662 (hereinafter, referred to as Patent Document 1) describes an angular velocity sensor including an annular frame, a drive part to cause the frame to oscillate within a predetermined plane, and a detection part to detect an angular velocity. The frame has a first set of beams opposed to each other and a second set of beams orthogonal to the first set of beams and opposed to each other. The drive part is constituted of a plurality of piezoelectric elements provided in the beams and causes the frame to oscillate within the predetermined plane in an oscillation mode where, when one of the first and second sets of beams comes closer to each other, the other set separates from each other, and when the one set separates from each other, the other set comes closer to each other. The detection part is constituted of a piezoelectric element capable of detecting, on the basis of an amount of deformation of the frame within the predetermined plane, an angular velocity about an axis perpendicular to the predetermined plane.

A piezoelectric device using a piezoelectric film for a drive unit typically utilizes a piezoelectric property that the piezoelectric film expands and contracts in a direction orthogonal to a voltage application direction. For example, in the angular velocity sensor described in Patent Document 1, the drive unit and the detector each have a lamination structure of a lower electrode layer, a piezoelectric material layer, and an upper electrode layer and are provided on the same surface of a frame.

SUMMARY

In recent years, for example, in a gyro sensor including a drive unit and a detector that are constituted of piezoelectric elements, an oscillation in an undesired resonant mode may occur and thus a stable oscillation may not be performed in a desired resonant mode. Thus, it is difficult to enhance the detection accuracy of the angular velocity.

In view of the above-mentioned circumstances, it is desirable to provide a piezoelectric device capable of realizing a stable oscillation in a desired resonant mode and an electronic apparatus including the same.

According to an embodiment of the present disclosure, there is provided a piezoelectric device including a vibrator, a piezoelectric drive unit, and a first piezoelectric detector.

The vibrator includes a first surface, a first groove, and a second groove. The first groove is formed along a first axis direction in the first surface. The second groove is formed in the first surface to be parallel to the first groove.

The piezoelectric drive unit includes a first electrode pair and a first piezoelectric body. The first electrode pair are provided in the first groove and opposed to each other in a second axis direction that is orthogonal to the first axis direction and parallel to the first surface. The first piezoelectric body is provided between the first electrode pair. The piezoelectric drive unit is configured to be capable of vibrating the vibrator in a plane parallel to the first surface due to voltage application between the first electrode pair.

The first piezoelectric detector includes a second electrode pair and a second piezoelectric body. The second electrode pair are provided in the second groove and opposed to each other in the second axis direction. The second piezoelectric body is provided between the second electrode pair. The first piezoelectric detector is configured to be capable of detecting a vibration of the vibrator in the plane parallel to the first surface.

In the piezoelectric device, a voltage application direction from the first electrode pair to the first piezoelectric body and an excitation direction of the vibrator are configured to coincide with each other. With this, it is possible to stably oscillate the vibrator in the plane parallel to the first surface and to highly accurately detect the vibration of the vibrator in this plane by the first piezoelectric detector.

The vibrator further may further include a second surface opposed to the first surface in a third axis direction orthogonal to the first axis direction and the second axis direction, and the first groove may be formed to have a depth extending from the first surface to the second surface and includes both side surface portions. In this case, the both side surface portions of the first groove are covered with the piezoelectric drive unit.

With this, it is possible to suppress the oscillation of the vibrator in a direction other than an inward direction of the first surface, and hence a stable oscillation in the inward direction of the first surface can be realized.

The vibrator may further include a plurality of arms that extend in the first axis direction and are arranged in the second axis direction. Each of the piezoelectric drive unit and the first piezoelectric detector may be provided in at least one arm of the plurality of arms.

The piezoelectric drive unit and the first piezoelectric detector may be provided in the same arm or in different arms.

The plurality of arms may include a first arm and a second arm. In this case, the piezoelectric drive unit may be provided in each of the first arm and the second arm and configured to be capable of vibrating the first arm and the second arm in opposite phases in the plane parallel to the first surface.

With this, for example, it is possible to configure the vibrator for detecting an angular velocity around the first axis.

The vibrator may further include a pair of first beams, a pair of second beams, and a plurality of connection portions. The pair of first beams extend in the first axis direction and are opposed to each other in the second axis direction. The pair of second beams extend in the second axis direction and are opposed to each other in the first axis direction. The plurality of connection portions connect between the first beam and the second beam.

In the case, the piezoelectric drive unit is provided in at least one beam of the first beam and the second beam such that the frame body vibrates in such a vibration mode that, when one pair of the pair of first beams and the pair of second beams move closer to each other, the other pair move away from each other, and, when the one pair move away from each other, the other pair move closer to each other.

With this, for example, it is possible to configure the vibrator for detecting an angular velocity around an axis perpendicular to the first surface.

The piezoelectric device may further include a support portion, a coupling portion, and an electrode structure.

The support portion is configured to support the vibrator. The coupling portion is configured to elastically couple between the vibrator and the support portion. The electrode structure is provided in the coupling portion and configured to be capable of electrostatically detecting a relative movement of the vibrator with respect to the support portion in the plane parallel to the first surface.

With this, it is possible to detect, based on a change in capacitance of the electrode structure, an acceleration in an in-plane direction that acts on the vibrator.

The piezoelectric device may further include a second piezoelectric detector.

The second piezoelectric detector is provided in the first surface and configured to be capable of detecting a vibration of the vibrator in a plane perpendicular to the first surface.

With this, it is possible to detect an angular velocity acting around an axis of the vibrator by the second piezoelectric detector.

The first groove may include a plurality of grooves arranged in parallel with each other. In this case, the first electrode pair include a plurality of electrode pairs that are provided in the plurality of grooves and electrically connected in parallel with one another. The first piezoelectric body includes a plurality of piezoelectric bodies provided between the plurality of electrode pairs.

Alternatively, the first electrode pair may include a plurality of electrode pairs that are provided in the first groove and electrically connected in parallel with one another. In this case, the first piezoelectric body includes a plurality of piezoelectric bodies that are provided between the plurality of electrode pairs.

With this, it is possible to increase a driving force of the piezoelectric drive unit.

The second groove may include a plurality of grooves arranged in parallel with each other. The second electrode pair include a plurality of electrode pairs that are provided in the plurality of grooves and electrically connected in series to one another. The second piezoelectric body includes a plurality of piezoelectric bodies that are provided between the plurality of electrode pairs.

Alternatively, the second electrode pair may include a plurality of electrode pairs that are provided in the second groove and electrically connected in series to one another. In this case, the second piezoelectric body includes a plurality of piezoelectric bodies that are provided between the plurality of electrode pairs.

With this, it is possible to increase a detection voltage of the first piezoelectric detector.

According to an embodiment of the present disclosure, there is provided a piezoelectric device. The piezoelectric device includes a vibrator, a piezoelectric drive unit, and a first piezoelectric detector.

The vibrator includes a first surface, a first groove, and a second groove. The first groove is formed along a first axis direction in the first surface. The second groove is formed in the first surface to be parallel to the first groove.

The piezoelectric drive unit includes a first electrode pair and a first piezoelectric body. The first electrode pair are provided in the first groove and opposed to each other in a second axis direction that is orthogonal to the first axis direction and parallel to the first surface. The first piezoelectric body is provided between the first electrode pair. The piezoelectric drive unit is configured to be capable of vibrating the vibrator in a plane parallel to the first surface due to voltage application between the first electrode pair.

The first piezoelectric detector includes a second electrode pair and a second piezoelectric body. The second electrode pair are provided in the second groove and opposed to each other in the second axis direction. The second piezoelectric body is provided between the second electrode pair. The first piezoelectric detector is configured to be capable of detecting a vibration of the vibrator in the plane parallel to the first surface.

As described above, according to the embodiments of the present disclosure, it is possible to realize a stable oscillation in a desired resonant mode.

These and other objects, features and advantages of the present disclosure will become more apparent in light of the following detailed description of best mode embodiments thereof, as illustrated in the accompanying drawings.

Additional features and advantages are described herein, and will be apparent from the following Detailed Description and the figures.

BRIEF DESCRIPTION OF THE FIGURES

FIGS. 6A and 6B are a main-part perspective view and a cross-sectional view showing a configuration example of an oscillator according to a comparison example;

FIG. 10 is a plane view schematically showing a configuration of a piezoelectric device according to a third embodiment of the present disclosure;

FIG. 11 is a cross-sectional view of the piezoelectric device according to the piezoelectric device according to the third embodiment;

FIGS. 19A to 19C are main-part process plane views explaining a method of polarizing the piezoelectric detector according to the fifth embodiment;

DETAILED DESCRIPTION

According to an embodiment of the present disclosure, there is provided a piezoelectric device including a vibrator, a piezoelectric drive unit, and a first piezoelectric detector.

The vibrator includes a first surface, a first groove, and a second groove. The first groove is formed along a first axis direction in the first surface. The second groove is formed in the first surface to be parallel to the first groove.

The piezoelectric drive unit includes a first electrode pair and a first piezoelectric body. The first electrode pair are provided in the first groove and opposed to each other in a second axis direction that is orthogonal to the first axis direction and parallel to the first surface. The first piezoelectric body is provided between the first electrode pair. The piezoelectric drive unit is configured to be capable of vibrating the vibrator in a plane parallel to the first surface due to voltage application between the first electrode pair.

The first piezoelectric detector includes a second electrode pair and a second piezoelectric body. The second electrode pair are provided in the second groove and opposed to each other in the second axis direction. The second piezoelectric body is provided between the second electrode pair. The first piezoelectric detector is configured to be capable of detecting a vibration of the vibrator in the plane parallel to the first surface.

Hereinafter, embodiments of the present disclosure will be described with reference to the drawings.

First Embodiment

Figure 1:
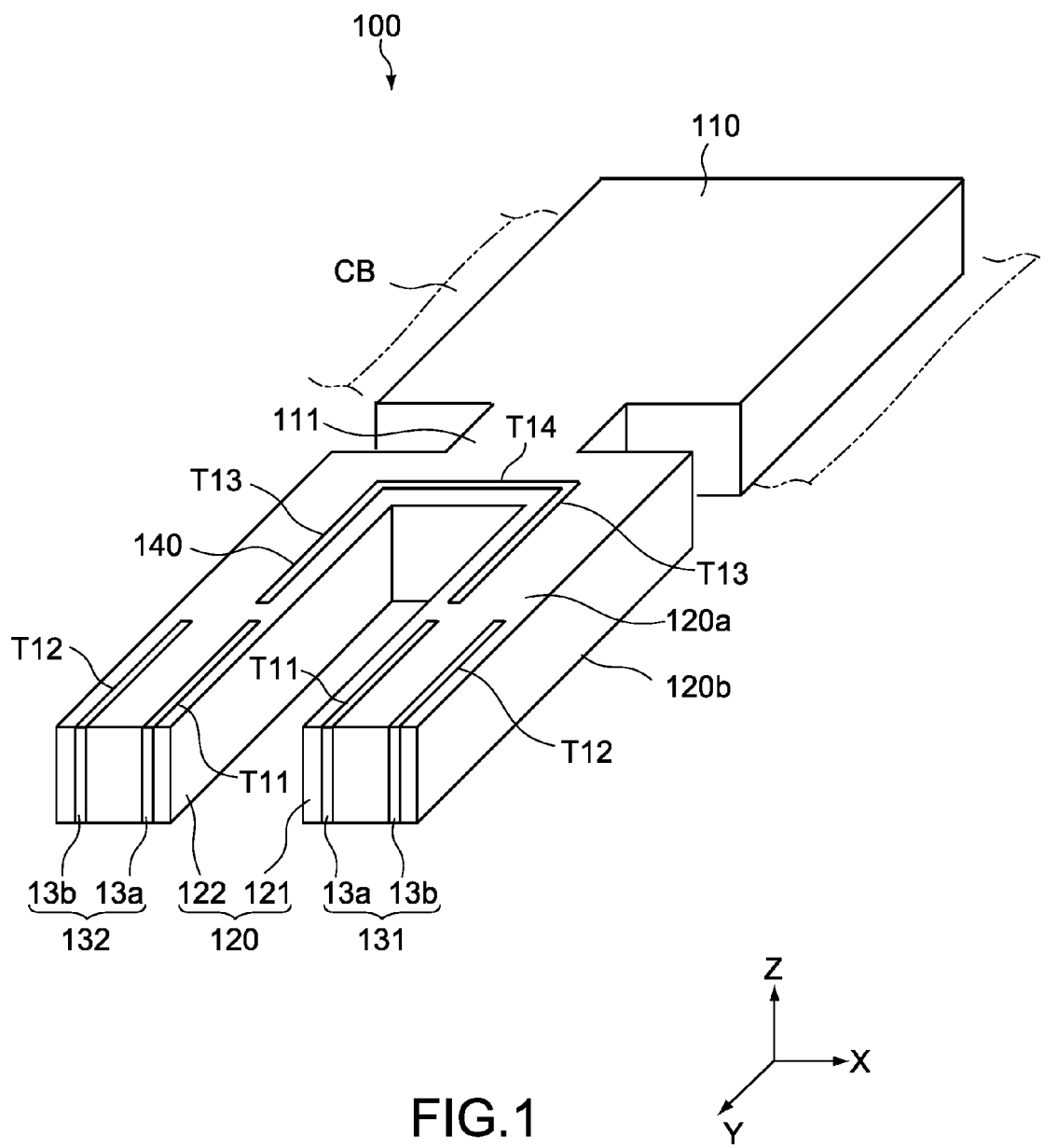
FIG. 1 is a schematic perspective view showing a configuration of a piezoelectric device according to a first embodiment of the present disclosure.

FIG. 1 is a schematic perspective view showing a configuration of a piezoelectric device according to a first embodiment of the present disclosure. In the figures, an X-axis, a Y-axis, and a Z-axis indicate three axis directions orthogonal to one another.

[Entire Configuration of Piezoelectric Device]

A piezoelectric device 100 according to this embodiment includes a base 110, a vibrator 120, piezoelectric drive units 131 and 132, and a piezoelectric detector 140 (first piezoelectric detector). The piezoelectric device 100 is configured as an oscillation device that oscillates the vibrator 120 at a predetermined resonant frequency along an X-axis direction. The piezoelectric device 100 is applied as, for example, a clock signal source in an electronic apparatus such as a computer.

The base 110 and the vibrator 120 are integrally fixed to each other. The base 110 and the vibrator 120 are formed by, for example, microfabricating a single-crystal silicon substrate that is a non-piezoelectric material to take the shape shown in the figure. In one surface (back surface) of the base 110, there is provided an external terminal (not shown) electrically and mechanically connected to a land on a circuit board CB installed into the electronic apparatus. The base 110 supports the vibrator 120 via a coupling portion 111 to be vibratable.

The vibrator 120 includes a plurality of arms that extend in a Y-axis direction and are arranged in the X-axis direction. In this embodiment, the vibrator 120 is configured as a tuning fork-shaped vibrator including a first arm 121 and a second arm 122. The first arm 121 and the second arm 122 extend in the Y-axis direction and are arranged at a predetermined interval in the X-axis direction.

The vibrator 120 includes a front surface 120a (first surface) and a back surface 120b (second surface) that are opposed to each other in a Z-axis direction (that are parallel to X-axis direction and Y-axis direction). In this embodiment, the front surface 120a of the vibrator 120 is formed flush with a front surface of the base 110. Further, the back surface 120b of the vibrator 120 is formed flush with a back surface of the base 110.

[Piezoelectric Drive Unit]

The piezoelectric drive units 131 and 132 are configured to be capable of vibrating the vibrator 120 (first arm 121 and second arm 122) in an XY-plane. In this embodiment, the piezoelectric drive units 131 and 132 may be provided in the first arm 121 and the second arm 122. However, the piezoelectric drive units 131 and 132 only need to be provided in at least one of the arms.

The piezoelectric drive unit 131 is provided in the first arm 121. The piezoelectric drive unit 132 is provided in the second arm 122. The piezoelectric drive units 131 and 132 have the same configuration. Each of the piezoelectric drive units 131 and 132 includes a first piezoelectric element 13a and a second piezoelectric element 13b.

Figure 2:
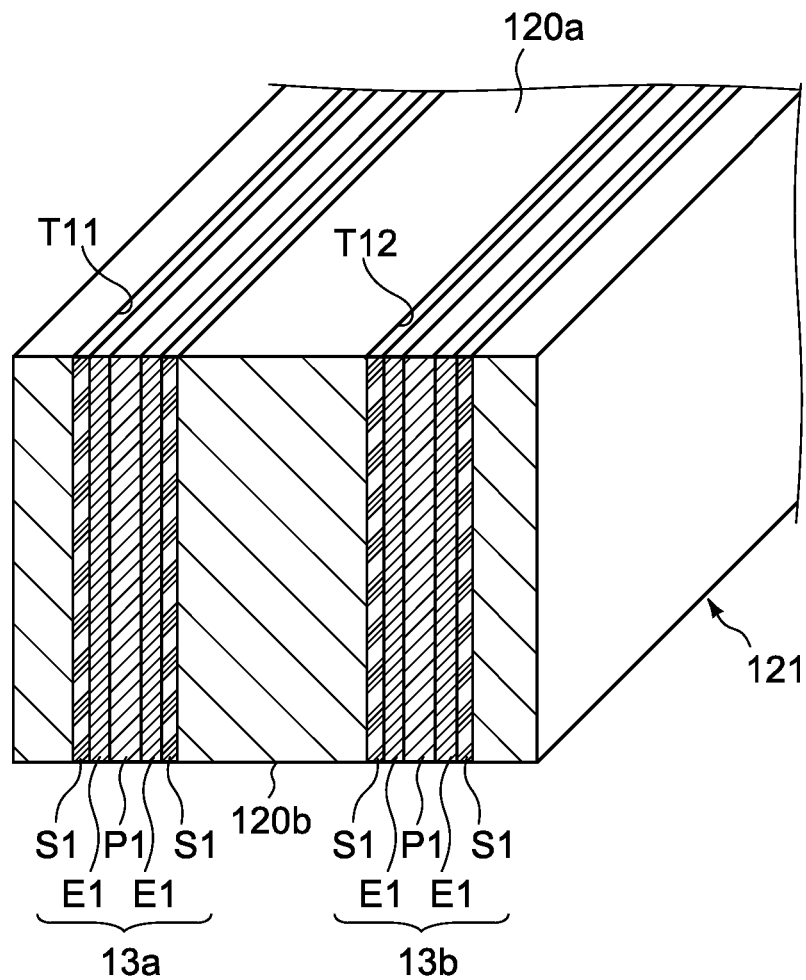
FIG. 2 is a main-part cross-sectional view of an arm, which shows a configuration of a piezoelectric drive unit in the piezoelectric device according to the first embodiment.

FIG. 2 is a main-part cross-sectional view of the first arm 121 showing a configuration of the piezoelectric drive unit 131. The first piezoelectric element 13a is provided in a groove T11 (first groove) formed in the front surface 120a of the first arm 121. The second piezoelectric element 13b is provided in a groove T12 (first groove) formed in the front surface 120a of the first arm 121.

Each of the grooves T11 and T12 is formed in the front surface 120a of the first arm 121 along the Y-axis direction. A width dimension along the X-axis direction, a length direction along the Y-axis direction, and a depth dimension along the Z-axis direction are the same between the grooves T11 and T12. These dimensions are not particularly limited and may be appropriately set depending on a vibration condition or the like. In this embodiment, the grooves T11 and T12 are formed to have a predetermined length from a leading end of the first arm 121 toward the base 110 and a depth extending from the front surface 120a of the first arm 121 to the back surface 120b.

As shown in FIG. 2, the first piezoelectric element 13a has a lamination structure of a pair of electrodes E1 (first electrode pair) and a piezoelectric layer P1 (first piezoelectric body).

The pair of electrodes E1 are provided in the groove T11 and opposed to each other in the X-axis direction. Each of the pair of electrodes E1 is attached to each of side surfaces of the groove T11 via an insulating film S1. The piezoelectric layer P1 is provided between the pair of electrodes E1. The piezoelectric layer P1 includes two main surfaces parallel to a YZ-plane and long in the Y-axis direction. One of the main surfaces is fixed to one of the pair of electrodes E1. The other of the main surfaces is fixed to the other of the pair of electrodes E1. With this, the both side surfaces of the groove T11 are covered with the first piezoelectric element 13a.

The second piezoelectric element 13b is configured in the same manner as the first piezoelectric element 13a. The second piezoelectric element 13b has a lamination structure of a pair of electrodes E1 opposed to each other in the X-axis direction and a piezoelectric layer P1 provided between the pair of electrodes E1. With this, both surfaces of the groove T12 are covered with the second piezoelectric element 13b.

The piezoelectric drive unit 132 provided in the second arm 122 is also configured in the same manner as described above. Specifically, as shown in FIG. 1, two grooves T11 and T12 are formed in the front surface 120a of the second arm 122 along the Y-axis direction. The first piezoelectric element 13a and the second piezoelectric element 13b are provided in these grooves T11 and T12.

As shown in FIG. 1, in the piezoelectric drive units 131 and 132, the first piezoelectric elements 13a are provided inside with respect to center-of-axis positions of the first arm 121 and the second arm 122. Further, the second piezoelectric elements 13b are provided outside with respect to the center-of-axis positions of the first arm 121 and the second arm 122.

The pair of electrodes E1 are typically formed of a metal material such as Ti (titanium), Pt (platinum), Cr (chromium), Au (gold), Cu (copper), and Al (aluminum). The piezoelectric layer P1 is typically formed of PZT (lead zirconate titanate). Alternatively, the piezoelectric layer P1 may be formed of, in addition to AlN (aluminum nitride), $KNbO_3$ (potassium niobate), and $Bi(Zr/Ti)O_3$ (bismuth zirconate titanate), an organic ferroelectric material such as PVDF (polyvinylidene fluoride) and P(VDF/TrFE) (copolymer of vinylidene fluoride and trifluoroethylene). The insulating film S1 is typically formed of a silicon dioxide film. Alternatively, the insulating film S1 may be formed of a silicon nitride film, an aluminum oxide film (alumina), or the like.

The piezoelectric drive units 131 and 132 are configured to be capable of vibrating the vibrator 120 (first arm 121 and second arm 122) in a plane (XY-plane) parallel to the front surface 120a thereof due to an inverse piezoelectric effect of the piezoelectric layer P1. The first piezoelectric element 13a and the second piezoelectric element 13b are connected to, for example, a self-excited oscillation circuit (not shown) mounted on the circuit board CB. The self-excited oscillation circuit includes, for example, a phase shift circuit and an automatic gain controller (AGC) and generates, based on a detection signal from the piezoelectric detector 140, a driving signal supplied to the piezoelectric drive units 131 and 132.

Figure 5A:
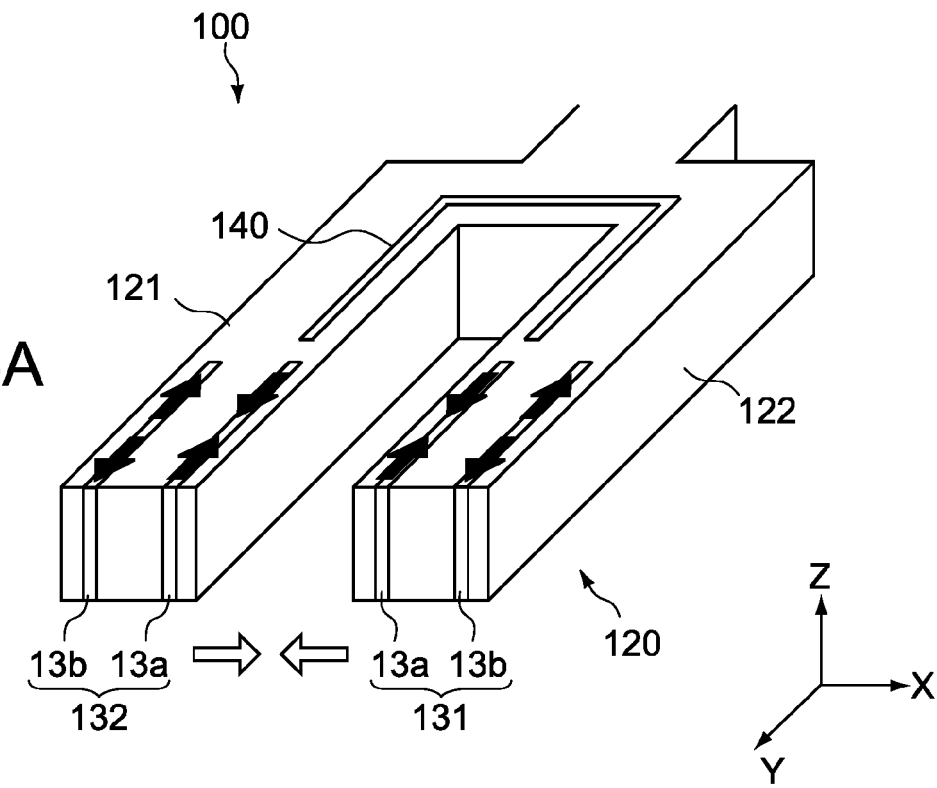
FIGS. 5A and 5B are main-part perspective views showing a typical motion example of the piezoelectric device according to the first embodiment.
Figure 5B:
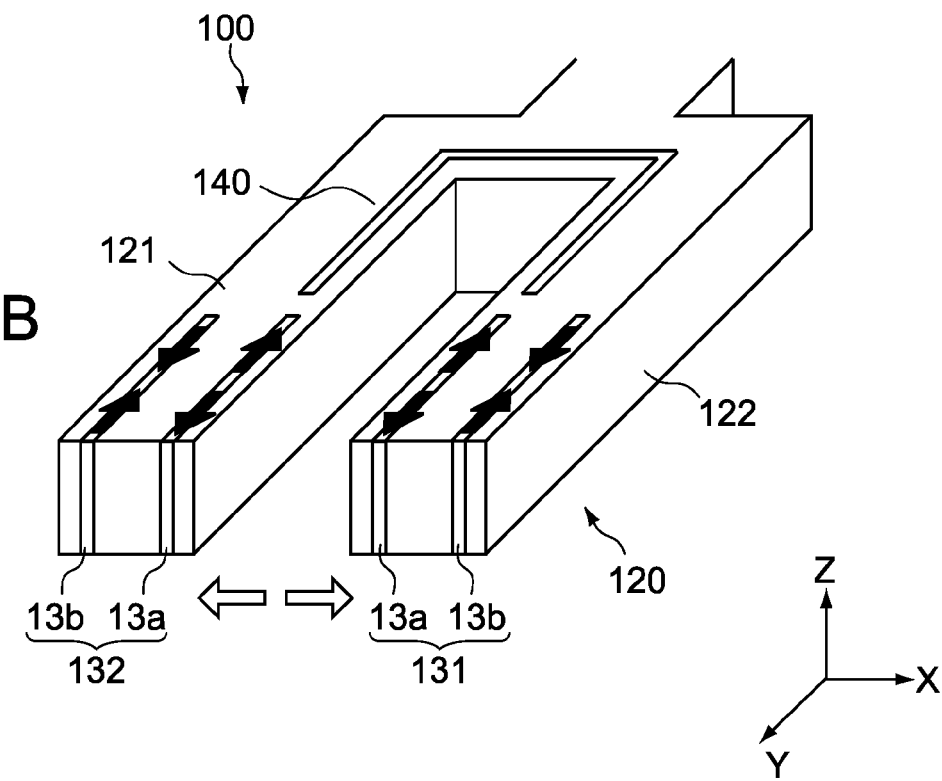

In this embodiment, alternating-current (AC) voltages are applied to the first piezoelectric element 13a and the second piezoelectric element 13b in opposite phases, such that the piezoelectric layer P1 of the first piezoelectric element 13a and the piezoelectric layer P1 of the second piezoelectric element 13b expand and contract alternately in opposite phases. With this, both of the first arm 121 and the second arm 122 are oscillated in opposite directions (FIGS. 5A and 5B).

[Piezoelectric Detector]

The piezoelectric detector 140 is configured to be capable of detecting a vibration of the vibrator 120 (first arm 121 and second arm 122) in the XY-plane. In this embodiment, the piezoelectric detector 140 is provided in the first arm 121 and the second arm 122. However, the piezoelectric detector 140 only needs to be provided in at least one of the arms.

The piezoelectric detector 140 is provided in a pair of grooves T13 (second groove) formed in the front surface 120a of the vibrator 120 and a groove T14 linking these grooves.

As shown in FIG. 1, the pair of grooves T13 are formed in the front surface 120a of the first arm 121 and the second arm 122 to have the same length along the Y-axis direction. In this embodiment, the pair of grooves T13 extend from longitudinal centers of the first arm 121 and the second arm 122 toward the base 110. The groove T14 is formed along the X-axis direction to link ends of these grooves T13 on a side of the base 110. Note that the groove T14 may be omitted if necessary.

The grooves T13 and T14 are formed to have the same width and depth. In this embodiment, similar to the grooves T11 and T12, the grooves T13 and T14 are formed to have a depth extending from the front surface 120a of the vibrator 120 to the back surface 120b.

Figure 3:
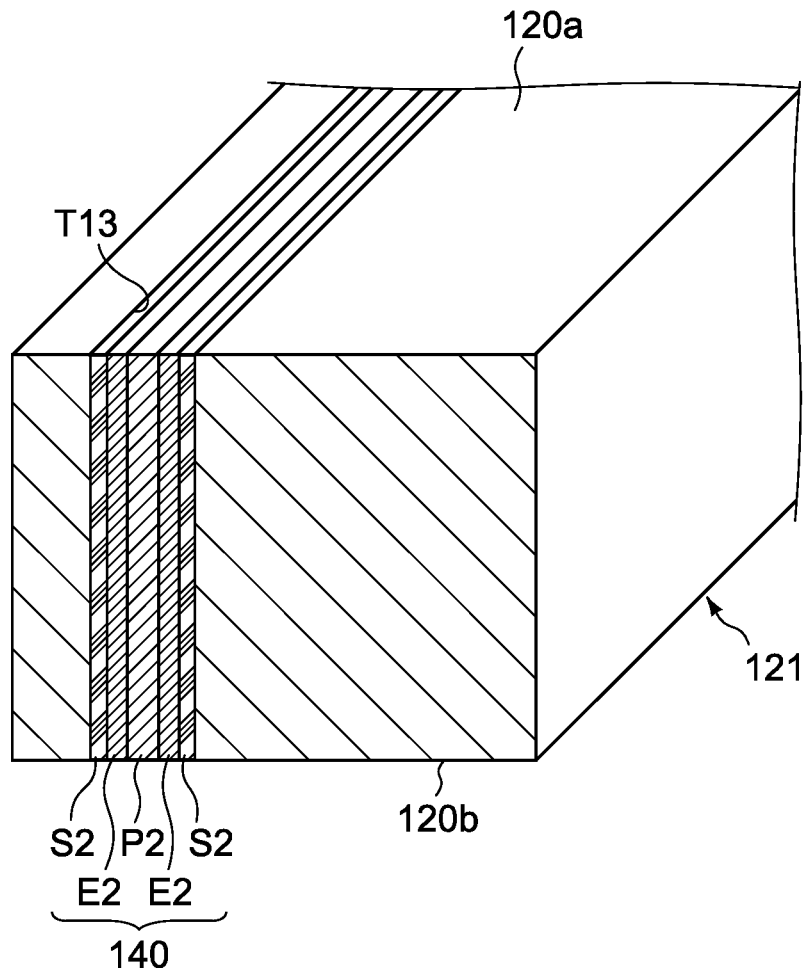
FIG. 3 is a main-part cross-sectional view of the arm, which shows a configuration of a piezoelectric detector in the piezoelectric device according to the first embodiment.

FIG. 3 is a main-part cross-sectional view of the first arm 121, which shows a configuration of the piezoelectric detector 140. The piezoelectric detector 140 has a lamination structure of a pair of electrodes E2 (second electrode pair) and a piezoelectric layer P2 (second piezoelectric body).

The pair of electrodes E2 are provided in the grooves T13 and T14. The pair of electrodes E2 are opposed to each other in the X-axis direction within the grooves T13. The pair of electrodes E2 are opposed to each other in the Y-axis direction within the groove T14. Each of the pair of electrodes E2 is attached to a side surface of each of the grooves T13 and T14 via an insulating film S2. The piezoelectric layer P2 is provided between the pair of electrodes E2. The piezoelectric layer P2 includes two main surfaces parallel to the YZ-plane and long in the Y-axis direction within the grooves T13. The piezoelectric layer P2 includes two main surfaces parallel to an XZ-plane and long in the X-axis direction within the groove T14. One main surface of the piezoelectric layer P2 is fixed to one of the pair of electrodes E2. The other main surface is fixed to the other of the pair of electrodes E2. With this, the both surfaces of the grooves T13 and T14 are covered with the piezoelectric detector 140.

The pair of electrodes E2 are typically formed of a metal material such as Ti (titanium), Pt (platinum), Cr (chromium), Au (gold), Cu (copper), and Al (aluminum). The piezoelectric layer P2 is typically formed of PZT (lead zirconate titanate). Alternatively, the piezoelectric layer P2 may be formed of, in addition to AlN (aluminum nitride), $KNbO_3$ (potassium niobate), and $Bi(Zr/Ti)O_3$ (bismuth zirconate titanate), an organic ferroelectric material such as PVDF (polyvinylidene fluoride) and P(VDF/TrFE) (copolymer of vinylidene fluoride and trifluoroethylene). The insulating film S2 is typically formed of a silicon dioxide film. Alternatively, the insulating film S2 may be formed of a silicon nitride film, an aluminum oxide film (alumina), or the like.

The piezoelectric detector 140 is configured to be capable of detecting a vibration of the vibrator 120 (first arm 121 and second arm 122) by detecting an electric potential difference caused due to a piezoelectric effect of the piezoelectric layer P2 via the pair of electrodes E2. The piezoelectric detector 140 is connected to, for example, the above-mentioned self-excited oscillation circuit mounted on the circuit board CB. A detection signal of the piezoelectric detector 140 is output to the self-excited oscillation circuit.

In this embodiment, the first arm 121 and the second arm 122 are excited in opposite directions and the common piezoelectric detector 140 is used in the first arm 121 and the second arm 122. Thus, the single piezoelectric detector 140 can detect an electric potential corresponding to a sum of amounts of deformation of both of the first arm 121 and the second arm 122.

Note that, although not shown in the figure, wiring patterns electrically connecting the piezoelectric drive units 131 and 132 and the piezoelectric detector 140 that are provided in the vibrator 120 with the circuit board CB are formed in the front surface or the back surface of the base 110 and the front surface 120a or the back surface 120b of the vibrator 120.

[Piezoelectric Layer]

The piezoelectric layers P1 in the piezoelectric drive units 131 and 132 are subjected to a polarization treatment in a voltage application direction. With this, the piezoelectric layers P1 expand and contract in a direction orthogonal to the voltage application direction. On the other hand, the piezoelectric layer P2 in the piezoelectric detector 140 converts expansion and contraction stresses acting in an in-plane direction thereof into an electric potential signal between the pair of electrodes E2. A representative of performance indexes of such piezoelectric properties is a piezoelectric constant d31. The driving mode of the piezoelectric layer as described above is known as a "d31 mode."

Figure 4A:
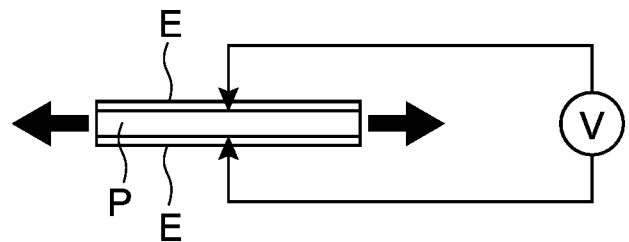
FIGS. 4A and 4B are diagrams explaining a motion example of a piezoelectric body driven in a d31 mode.
Figure 4B:
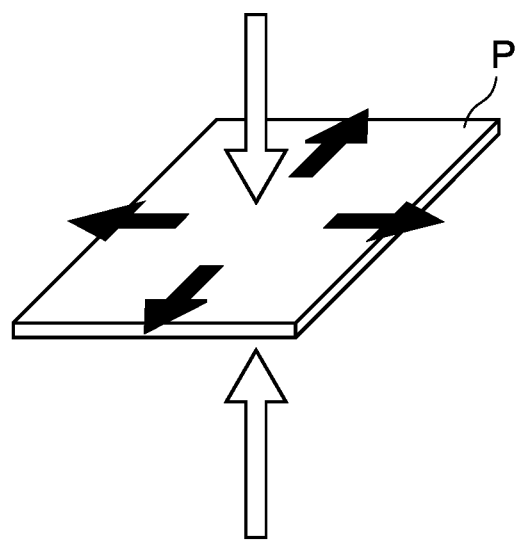

FIGS. 4A and 4B are diagrams explaining a motion example of the piezoelectric layer having such piezoelectric properties. In the figures, the black arrow indicates a stress direction and the white arrow indicates a voltage application direction.

A piezoelectric layer P sandwiched between a pair of electrodes E generates a stress in an in-plane direction orthogonal to a thickness direction thereof when a voltage is applied in the thickness direction. The direction of the stress depends on a direction of an electric field applied to the piezoelectric layer P. Typically, one of the pair of electrodes E is connected to a reference electric potential (e.g., ground electric potential). When a voltage having a positive polarity is, for example, applied to the other of the pair of electrodes E, a tension stress is generated in the piezoelectric layer P such that the piezoelectric layer P expands in the in-plane direction. When a voltage having a negative polarity is applied, a compression stress is generated in the piezoelectric layer P such that the piezoelectric layer P contracts in the in-plane direction. Thus, the AC voltage is applied to the other of the pair of electrodes E, and hence periodic expansion and contraction stresses are generated in the surface of the piezoelectric layer P.

If the piezoelectric layer P is a strip shape including a long side in one axis direction, the expansion and contraction stresses of the piezoelectric layer P mainly act in a direction of the long side. Also in this embodiment, the first piezoelectric elements 13a and the second piezoelectric elements 13b are formed in a strip shape including a long side in an extending direction of the first arm 121 and the second arm 122. The first piezoelectric elements 13a and the second piezoelectric elements 13b are provided such that film surfaces of the piezoelectric layers P1 are orthogonal to a vibration direction of the first arm 121 and the second arm 122. Therefore, the expansion and contraction stresses of the piezoelectric layer P1 are limited in a longitudinal direction of the first arm 121 and the second arm 122

[Typical Operation of Piezoelectric Device]

FIGS. 5A and 5B are main-part perspective views showing a typical motion example of the piezoelectric device 100 according to this embodiment.

When an AC voltage at a predetermined frequency is applied from the self-excited oscillation circuit on the circuit board CB to the piezoelectric drive units 131 and 132, the vibrator 120 (first arm 121 and second arm 122) of the piezoelectric device 100 is vibrated in the XY-plane. An oscillation frequency of the vibrator 120 is set based on a natural frequency of the first arm 121 and the second arm 122. With this, the vibrator 120 functions as an oscillator that resonates at this natural frequency.

In this embodiment, as described above, opposite-phase driving signals are input into the first piezoelectric element 13a and the second piezoelectric element 13b of each of the piezoelectric drive units 131 and 132. Therefore, in the first piezoelectric element 13a and the second piezoelectric element 13b, expansion and contraction motions of the piezoelectric layers P1 are opposite. Thus, the first piezoelectric elements 13a contract in the Y-axis direction and the second piezoelectric elements 13b expand in the Y-axis direction, and hence both of the first arm 121 and the second arm 122 are deformed in directions closer to each other (FIG. 5A). In contrast, the first piezoelectric elements 13a expand in the Y-axis direction and the second piezoelectric elements 13b contract in the Y-axis direction, and hence both of the first arm 121 and the second arm 122 are deformed in directions away from each other (FIG. 5B).

The piezoelectric detector 140 outputs a detection signal corresponding to a vibration state of the vibrator 120 to the self-excited oscillation circuit. The self-excited oscillation circuit generates, based on the detection signal output from the piezoelectric detector 140, a driving signal and outputs the driving signal to the piezoelectric drive units 131 and 132. With this, the vibrator 120 performs a self-oscillation at its natural vibration frequency.

The piezoelectric device 100 according to this embodiment is configured such that the voltage application direction with respect to the piezoelectric layers P1 of the piezoelectric drive units 131 and 132 coincides with an excitation direction of the vibrator 120. With this, it is possible to stably oscillate the vibrator 120 in the XY-plane and to highly accurately detect the vibration of the vibrator in the XY-plane by the piezoelectric detector 140.

Next, the above-mentioned actions of this embodiment will be described in comparison with an oscillator according to a comparison example.

FIG. 6A is a main-part perspective view showing a configuration example of an oscillator 150 according to the comparison example. The oscillator 150 includes a pair of piezoelectric drive units 171 and 172 provided on a front surface 160a of the first arm 161 and the second arm 162, as drive units that oscillate a vibrator 160 including a first arm 161 and a second arm 162 in the XY-plane. Specifically, the pair of piezoelectric drive units 171 and 172 are provided on outer edges of the first arm 161 and the second arm 162, respectively.

The piezoelectric drive units 171 and 172 have the same configuration. Each of the piezoelectric drive units 171 and 172 has a lamination structure of a pair of electrodes E3 and a piezoelectric layer P3 provided between the pair of electrodes E3. FIG. 6B is a main-part cross-sectional view of the first arm 161, which shows a configuration of the piezoelectric drive unit 171. The piezoelectric drive units 171 and 172 are formed in a strip shape including a long side in the Y-axis direction and provided on the front surface 160a of the first arm 161 and the second arm 162. The piezoelectric layer P3 is configured to expand and contract in the Y-axis direction shown by the black arrow directions in FIG. 6A when an AC voltage is applied in the Z-axis direction via the pair of electrodes E3.

In the oscillator 150 shown in FIGS. 6A and 6B, in order to vibrate the first arm 161 and the second arm 162 in the XY-plane, the piezoelectric drive units 171 and 172 are provided along the outer edges of the first arm 161 and the second arm 162. With this, as shown by the white arrows in the figure, the first arm 161 and the second arm 162 can alternately repeat a deformation in directions closer to each other in the X-axis direction and a deformation in directions away from each other. In addition, at the same time as such a deformation, a vibration in a direction (Z-axis direction) perpendicular to the XY-plane is induced. Consequently, each of the first arm 161 and the second arm 162 is excited in an oblique direction being a synthetic direction of them.

As described above, in the oscillator 150 according to the comparison example, a film surface of the piezoelectric layer P3 is provided to be parallel to the excitation direction of the vibrator 120, and hence not only a desired vibration mode in the X-axis direction but also an undesired vibration mode in the Z-axis direction occur. Thus, in the oscillator 150 according to the comparison example, it is difficult to perform a stable oscillation in a resonant mode along the desired vibration direction. Further, it is necessary to devise the oscillation circuit or the like in order to realize a stable operation, which causes a problem that the circuit scale increases.

In addition, in the oscillator 150 according to the comparison example, a piezoelectric layer for detection is typically provided such that a film surface thereof is parallel to the front surface of the vibrator 160 as a piezoelectric detector that detects a vibration of the vibrator 160. Therefore, not only the vibration of the first arm 161 and the second arm 162 in the X-axis direction but also the vibration of the first arm 161 and the second arm 162 in X-axis direction are detected. Thus, there is a problem that it is difficult to obtain a sufficient detection signal with respect to a displacement of the vibrator 160 in the XY-plane.

In contrast, in the piezoelectric device 100 according to this embodiment, the film surfaces of the piezoelectric layers P1 of each of the piezoelectric drive units 131 and 132 are provided to be orthogonal to the desired vibration direction (X-axis direction) of the vibrator 120. Therefore, according to this embodiment, it is possible to limit the oscillation of the vibrator 120 in an unnecessary natural vibration mode in the Z-axis direction and to realize a stable oscillation motion of the vibrator 120 in the XY-plane. Further, a sufficient signal with respect to the displacement of each of the first arm 121 and the second arm 122 in the XY-plane is acquired by the piezoelectric detector 140. With this, it is possible to enhance the detection accuracy.

[Method of Manufacturing Piezoelectric Device]

Next, a method of manufacturing the piezoelectric device 100 according to this embodiment will be described. The piezoelectric device 100 is manufactured by an MEMS technique. FIGS. 7A to 7D are explanatory diagrams of the method of manufacturing the piezoelectric device 100, which show processes of manufacturing the piezoelectric drive unit 131.

Figure 7A:
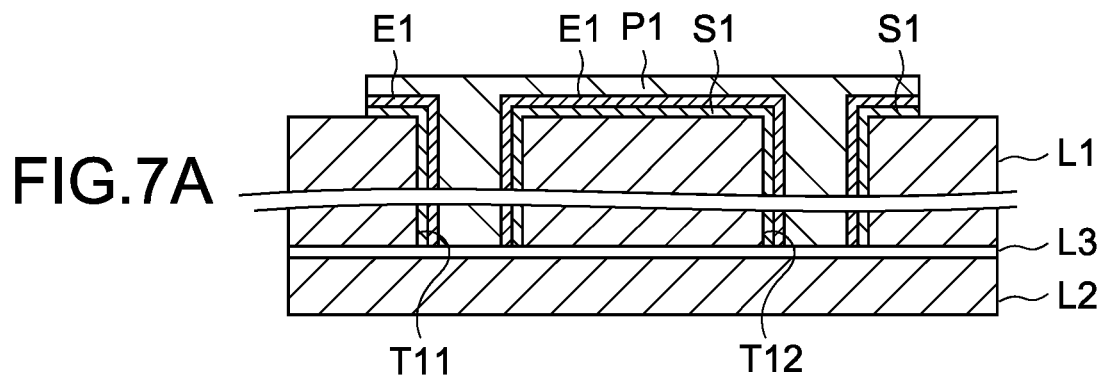
FIGS. 7A to 7D are main-part process cross-sectional views explaining a method of manufacturing the piezoelectric device according to the first embodiment.

FIG. 7A shows a process of forming the insulating films S1, the pair of electrodes E1, and the piezoelectric layers P1. The piezoelectric device 100 according to this embodiment is manufactured using a silicon on insulator (SOI) substrate. Typically, the SOI substrate is formed by bonding two single-crystal silicon substrates L1 and L2 to each other via a middle layer L3 formed of a silicon dioxide film. Then, by subjecting the one silicon substrate L1 to reactive ion etching (RIE) via a resist mask (not shown), the grooves T11 and T12 are formed in a formation area of each of the first arm 121 and the second arm 122. At this time, the middle layer L3 functions as an etching stopper layer.

After the formation of the grooves T11 and T12, the insulating film S1 that covers both side surfaces of each of the grooves T11 and T12 is formed. The insulating film S1 may be a thermally-oxidized film of the silicon substrate L1 or may be formed by a chemical vapor deposition (CVD) method, sputtering, or the like. Part of the insulating film S1 that covers a bottom of each of the grooves T11 and T12 is removed by etching. Next, a metal film forming the pairs of electrodes E1 is formed by sputtering, plating, or the like. Part of the metal film that covers the bottom of each of the grooves T11 and T12 is removed by anisotropic etching such as dry etching.

Subsequently, the piezoelectric layer P1 is formed by sputtering, a pulsed laser ablation (PLD) method, a sol-gel method, or the like. The piezoelectric layer P1 is formed to fill the grooves T11 and T12. However, the piezoelectric layer P1 is not limited thereto. The insulating film S1 on the silicon substrate L1, the metal film (pairs of electrodes E1), and the piezoelectric layer P1 are stacked in the stated order. After that, the insulating film S1 on the silicon substrate L1, the metal film (pairs of electrodes E1), and the piezoelectric layer P1 are patterned into predetermined shapes.

Figure 7B:
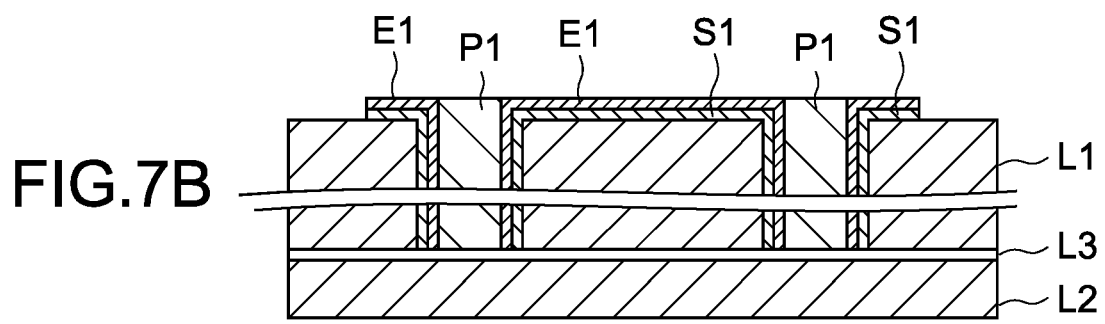

Next, as shown in FIG. 7B, the piezoelectric layer P1 that covers an area other than the grooves T11 and T12 on the silicon substrate L1 is removed. In this process, an appropriate planarization method such as a chemical mechanical planarization (CMP) method and an etchback method can be employed. At this time, the insulating film S1 and the pair of electrodes E1 are formed such that one side surface of the groove T11 and one side surface of the groove T12 are coupled to each other.

Figure 7C:
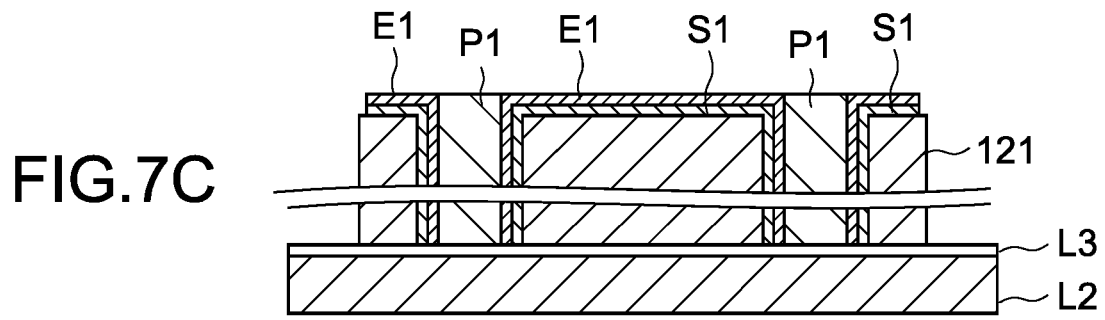
Figure 7D:
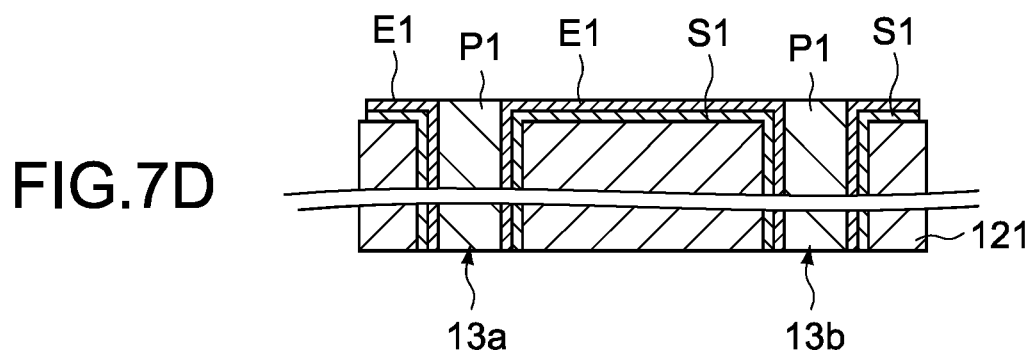

Subsequently, as shown in FIG. 7C, an outer shape of the piezoelectric device 100 and the first arm 121 and the second arm 122 are formed by subjecting the silicon substrate L1 to reactive ion etching (RIE) via a resist mask (not shown). Also at this time, the middle layer L3 functions as the etching stopper layer. Then, as shown in FIG. 7D, the first piezoelectric element 13a and the second piezoelectric element 13b that constitutes the piezoelectric drive unit 131 are manufactured by removing the silicon substrate L2 and the middle layer L3 from the silicon substrate L1.

Also the piezoelectric drive unit 132 provided in the second arm 122 is manufactured through the same processes as described above. Typically, the piezoelectric drive units 131 and 132 are manufactured by the identical processes. The piezoelectric detector 140 is also manufactured through the same processes as the piezoelectric drive units 131 and 132. Also in this case, the piezoelectric detector 140 can be manufactured at the same time as the manufacture of the piezoelectric drive units 131 and 132 with the same materials as the piezoelectric drive units 131 and 132.

Second Embodiment

Figure 8:
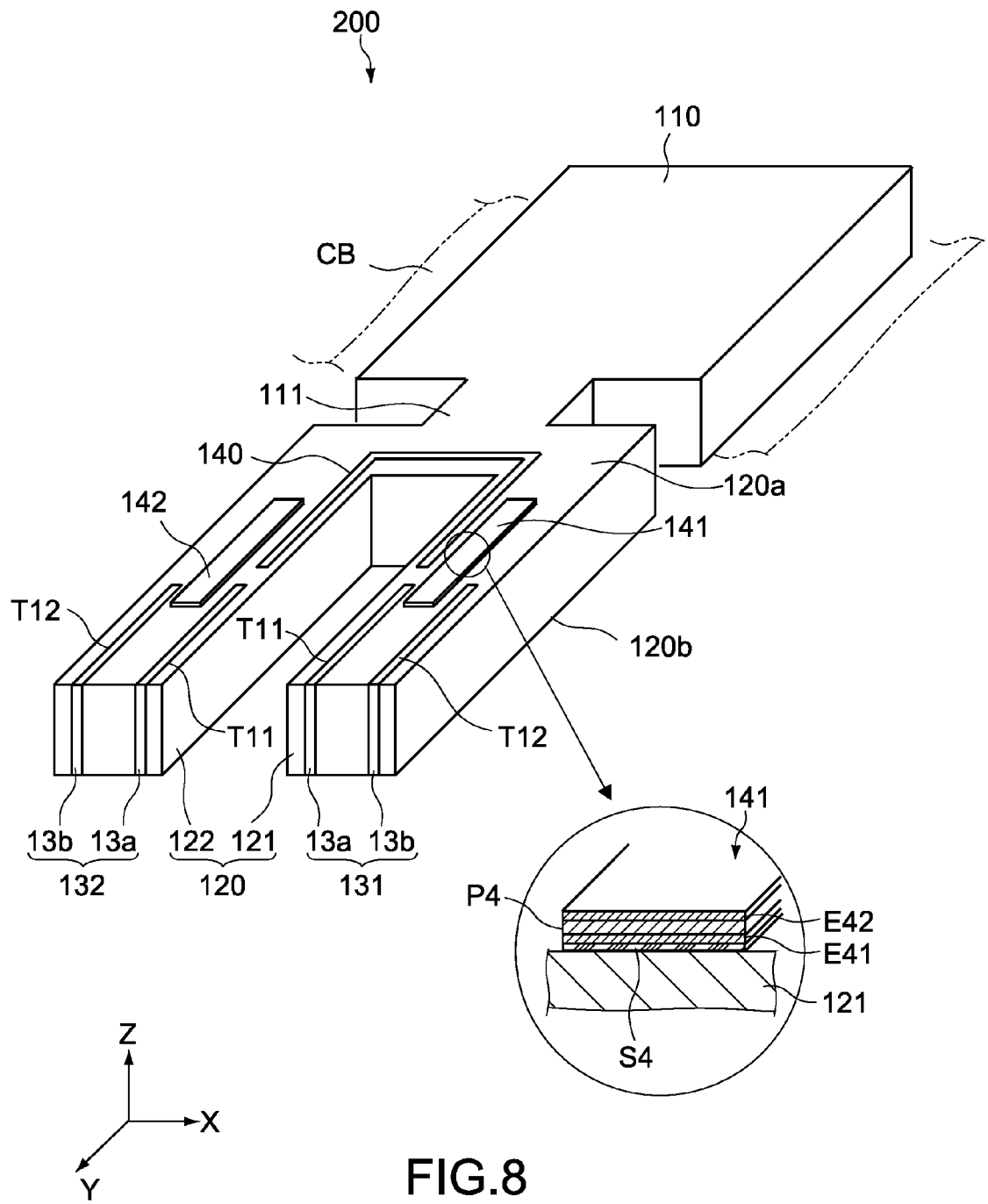
FIG. 8 is a schematic perspective view of a piezoelectric device according to a second embodiment of the present disclosure and a main-part cross-sectional view thereof.

FIG. 8 is a schematic perspective view of a piezoelectric device according to a second embodiment of the present disclosure and a main-part cross-sectional view thereof. Hereinafter, components different from those of the first embodiment will be mainly described and the same components as those the above-mentioned embodiment will be denoted by the same reference symbols and descriptions thereof will be omitted or simplified.

A piezoelectric device 200 according to this embodiment is configured as a vibration gyro sensor (angular velocity sensor). The piezoelectric device 200 is applied as, for example, a sensor for shake detection or a sensor for direction detection in an electronic apparatus such as a camera and a car navigation system.

In the piezoelectric device 200 according to this embodiment, second piezoelectric detectors 141 and 142 are provided on the front surface 120a of the first arm 121 and the second arm 122, respectively. The second piezoelectric detectors 141 and 142 can be configured to be capable of detecting vibrations of the first arm 121 and the second arm 122 in a surface (YZ-plane) perpendicular to the front surface 120a.

The second piezoelectric detectors 141 and 142 have the same configuration. Each of the second piezoelectric detectors 141 and 142 is formed of a laminate of a lower electrode layer E41 (first electrode layer), a piezoelectric layer P4, and an upper electrode layer (second electrode layer) E42. Each of the second piezoelectric detectors 141 and 142 is formed in a strip shape including a long side in the Y-axis direction. A film surface of the piezoelectric layer is formed to be parallel to the front surface 120a of the vibrator 120.

The lower electrode layer E41 is provided on the front surface 120a of the first arm 121 and the second arm 122. In this embodiment, each of the first arm 121 and the second arm 122 is formed of a semiconductor material (single-crystal silicon), and hence the lower electrode layer E41 is provided on the front surface 120a via an insulating layer S4. The upper electrode layer E42 is opposed to the lower electrode layer E41 in a direction (Z-axis direction) perpendicular to the front surface 120a. The piezoelectric layer P4 is provided between the lower electrode layer E41 and the upper electrode layer E42.

The piezoelectric layer P4 is subjected to a polarization treatment in the Z-axis direction. When the piezoelectric layer P4 receives a compression stress or a tension stress along the Y-axis direction, a predetermined electric potential difference is caused between the upper electrode layer E41 and the lower electrode layer E42. For example, when either one of the first arm 121 and the second arm 122 is deformed in a positive Z-direction, the piezoelectric layer P4 contracts in the Y-axis direction. When the either one of the first arm 121 and the second arm 122 is deformed in a negative Z-direction, the piezoelectric layer P4 expands in the Y-axis direction. The polarity of the electric potential between the upper electrode layer E41 and the lower electrode layer E42 depends on expansion and contraction directions of the piezoelectric layer P4 along the Y-axis direction. The upper electrode layer E41 and the lower electrode layer E42 are electrically connected to an angular velocity detection circuit (not shown) on the circuit board CB. Typically, one of the upper electrode layer E41 and the lower electrode layer E42 is connected to a reference electric potential (e.g., ground electric potential or predetermined offset electric potential).

The upper electrode layer E41 and the lower electrode layer E42 are formed of the same material as that of the pairs of electrodes E1 in the piezoelectric drive units 131 and 132 or the pair of electrodes E2 in the first piezoelectric detector 140, for example. The piezoelectric layer P4 is also formed of the same material as that of the piezoelectric layer P1 in the piezoelectric drive units 131 and 132 or the piezoelectric layer P2 in the first piezoelectric detector 140, for example.

In this embodiment, the second piezoelectric detectors 141 and 142 are provided on the front surface 120a along centers of axes of the first arm 121 and the second arm 122. The length (length of long side) along the Y-axis direction of the second piezoelectric detectors 141 and 142 is not particularly limited. The length only needs to be such a length that a displacement of the first arm 121 and the second arm 122 along the Z-axis direction can be detected.

In the thus configured piezoelectric device 200 according to this embodiment, as in the above-mentioned first embodiment, the first arm 121 and the second arm 122 perform a self-oscillation in the XY-plane due to the piezoelectric drive units 131 and 132 and the first piezoelectric detector 140. When an angular velocity around the Y-axis acts on the vibrator 120 in this state, the first arm 121 and the second arm 122 are deformed in the Z-axis direction due to a Coriolis force. A voltage signal corresponding to the amount of deformation is output from the second piezoelectric detectors 141 and 142 to the above-mentioned angular velocity detection circuit. Thus, the angular velocity around the Y-axis that acts on the piezoelectric device 200 is detected.

According to this embodiment, it is possible to realize a stable oscillation motion of the first arm 121 and the second arm 122 in the XY-plane. Therefore, the detection accuracy of the Coriolis force along the Z-axis direction that acts on the first arm 121 and the second arm 122, that is, the angular velocity around the Y-axis can be enhanced.

FIGS. 9A to 9D are explanatory diagrams for a method of manufacturing the piezoelectric device 200, which show processes of manufacturing the piezoelectric drive unit 131 and a second piezoelectric detector 141. The second piezoelectric detector 141 is manufactured in the process of manufacturing the piezoelectric drive unit 131.

Figure 9A:
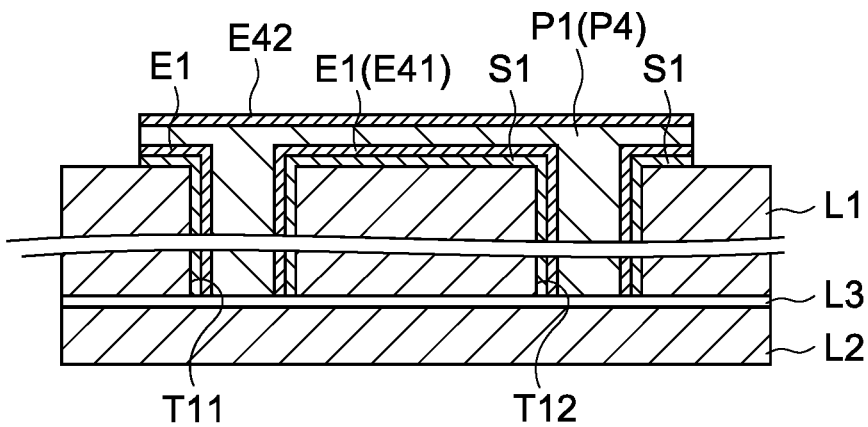
FIGS. 9A to 9D are main-part process cross-sectional views explaining the method of manufacturing the piezoelectric device according to the second embodiment.
Figure 9B:
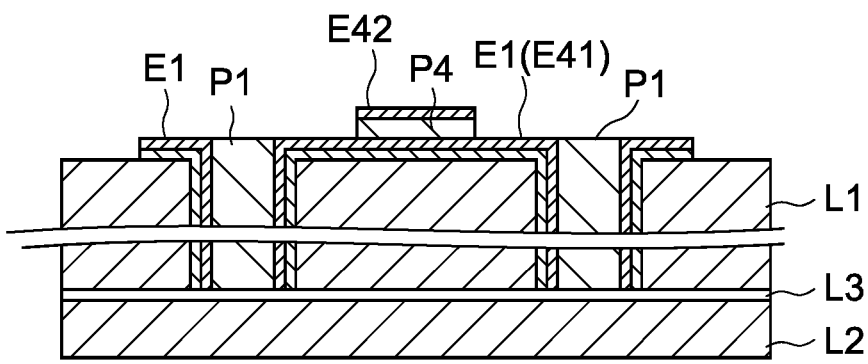
Figure 9C:
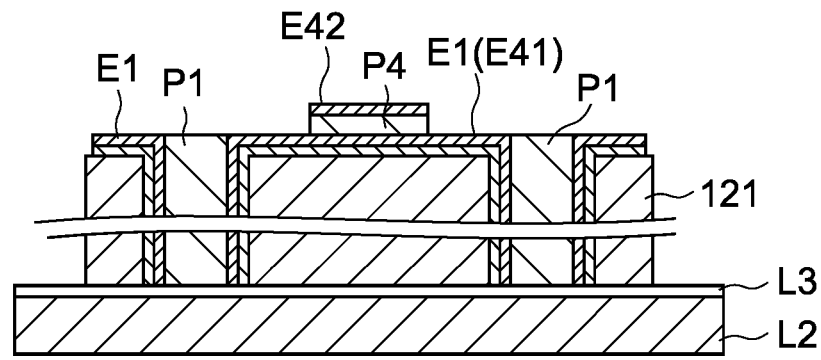
Figure 9D:
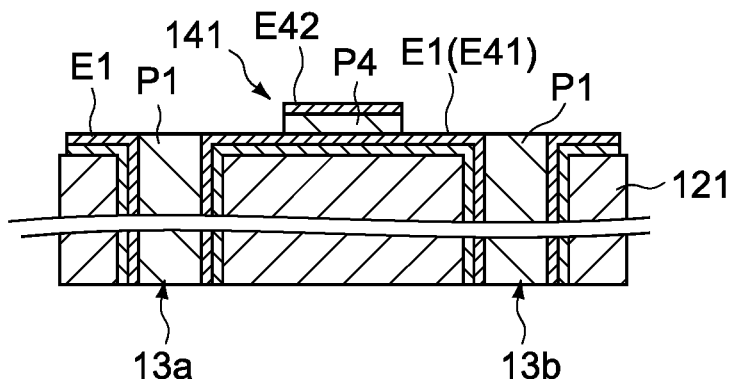

In this embodiment, as shown in FIG. 9A, part of the metal film constituting the pair of electrodes E1 is configured as the lower electrode layer E41. The upper electrode layer E42 is formed on the piezoelectric layer P1. The respective layers are patterned. Then, as shown in FIG. 9B, the piezoelectric layer P1 is partially etched. Thus, the piezoelectric layer P4 is formed. The metal film forming the pair of electrodes E1 is isolated to partition a formation area of the pair of electrodes E1 and a formation area of the lower electrode layer E41. After that, as shown in FIG. 9C, the first arm 121 and the second arm 122 are subjected to shaping. In addition, as shown in FIG. 9D, the silicon substrate L2 and the middle layer L3 are removed.

The second piezoelectric detector 142 provided on the second arm 122 is also manufactured through the same processes as described above. Typically, the second piezoelectric detectors 141 and 142 are manufactured in the identical processes

Third Embodiment

FIG. 10 is a plane view schematically showing a configuration of a piezoelectric device according to a third embodiment of the present disclosure. FIG. 11 is a cross-sectional view thereof.

A piezoelectric device 300 according to this embodiment is configured as a vibration gyro sensor (angular velocity sensor). The piezoelectric device 300 is applied as, for example, a sensor for shake detection or a sensor for direction detection in an electronic apparatus such as a camera and a car navigation system.

[Vibrator]

The piezoelectric device 300 according to this embodiment includes a vibrator 320. The vibrator 320 includes an annular frame body 330 and a plurality of pendulums 340.

The frame body 330 includes a horizontal direction in an a-axis direction, a vertical direction in a b-axis direction, and a thickness direction in a c-axis direction. On the other hand, in FIG. 10, the Y-axis is set in an axis direction parallel to an a-axis and the X-axis is set in a direction parallel to a b-axis. The Z-axis direction is an axis direction parallel to a c-axis direction.

Each of sides of the frame body 330 functions as a vibration beam. The frame body 330 includes a pair of first beams 31a and 31b extending in parallel with each other in the a-axis direction and a pair of second beams 32a and 32b extending in parallel with each other in the b-axis direction orthogonal to the a-axis direction. The first beams 31a and 31b and the second beams 32a and 32b have the same length, width, and thickness. The frame body 330 has a hollow square shape in appearance.

In portions of the frame body 330 that correspond to four corners, there are formed connection portions 33a, 33b, 33c, and 33d connecting between the first beams 31a and 31b and the second beams 32a and 32b. Both ends of the first beams 31a and 31b and the second beams 32a and 32b are supported by the connection portions 33a to 33d. The frame body 330 is fixed to be vibratable in the XY-plane with respect to a circuit board (not shown) via a plurality of support portions 34 formed in the connection portions 33a to 33d.

The plurality of pendulums 340 includes first pendulums 41a and 41b and second pendulums 42a and 42b. The first pendulums 41a and 41b are formed in one pair of connection portions 33a and 33c that are in a diagonal relationship, respectively. The first pendulums 41a and 41b extend inside the frame body 330 along a direction of the diagonal line. The second pendulums 42a and 42b are formed in the other pair of connection portions 33b and 33d that are in a diagonal relationship. The second pendulums 42a and 42b extend inside the frame body 330 along a direction of the diagonal line. The one ends of the first pendulums 41a and 41b and the second pendulums 42a and 42b are fixed to the connection portions 33a to 33d, respectively. The other ends thereof are set as free ends and function as vibration weights provided near a center of the frame body 330. Further, portions between the one ends fixed to the connection portions 33a to 33d and the other ends will be referred to as arms M.

The first beams 31a and 31b, the second beams 32a and 32b, the connection portions 33a to 33d, the first pendulums 41a and 41b, the second pendulums 42a and 42b, and the plurality of support portions 34 are integrally formed and manufactured by, for example, microfabricating a single-crystal silicon substrate that is a non-piezoelectric material

[Piezoelectric Drive Unit]

The piezoelectric device 300 includes first piezoelectric drive units 351 and second piezoelectric drive units 352 as drive units that vibrate the frame body 330. The first piezoelectric drive units 351 are provided along the a-axis direction in the first beams 31a and 31b, respectively. The second piezoelectric drive units 352 are provided along the b-axis direction in the second beams 32a and 32b, respectively. In FIG. 10, for easy understanding, the first piezoelectric drive units 351 and the second piezoelectric drive units 352 are shown by different kinds of hatching, respectively.

The first piezoelectric drive units 351 and the second piezoelectric drive units 352 are configured in the same manner as the first piezoelectric element 13a and the second piezoelectric element 13b (FIG. 2) described in the first embodiment. Each of the first piezoelectric drive units 351 and the second piezoelectric drive units 352 has a lamination structure of a pair of electrodes and a piezoelectric layer provided between the pair of electrodes. In this embodiment, each of the first piezoelectric drive units is formed in a strip shape including a long side in the a-axis direction. The first piezoelectric drive units 351 are provided in the first beams 31a and 31b such that film surfaces of the piezoelectric layers are orthogonal to the b-axis direction. Each of the second piezoelectric drive units 352 is formed in a strip shape including a long side in the b-axis direction. The second piezoelectric drive units 352 are provided in the second beams 32a and 32b such that film surfaces of the piezoelectric layers are orthogonal to the a-axis direction (FIG. 11).

The first piezoelectric drive units 351 and the second piezoelectric drive units 352 have the same configuration. Each of the first piezoelectric drive units 351 and the second piezoelectric drive units 352 is formed such that a width dimension thereof along the c-axis direction is equal to a thickness dimension of the frame body 330 along the c-axis direction. The first piezoelectric drive units 351 are provided in grooves formed along the a-axis direction in a front surface of the first beams 31a and 31b. The second piezoelectric drive units 352 are provided in grooves formed along the b-axis direction in the front surface of the second beams 32a and 32b. The grooves are provided on an outer peripheral side of the frame body 330 with respect to center-of-axis positions of the first beams 31a and 31b and the second beams 32a and 32b.

Each of the first piezoelectric drive units 351 and the second piezoelectric drive units 352 is connected to a self-excited oscillation circuit (not shown) and AC voltages are configured to be applied to the first piezoelectric drive units 351 and the second piezoelectric drive units 352 in opposite phases. The first piezoelectric drive units 351 and the second piezoelectric drive units 352 contract and expand in a longside direction depending on a polarity of an input voltage. Due to a driving force of the deformation, the first beams 31a and 31b and the second beams 32a and 32b are vibrated. A direction of the deformation is controlled by the polarity of the input voltage. The first piezoelectric drive units 351 and the second piezoelectric drive units 352 vibrate the frame body 330 in the XY-plane in such a vibration mode that, when one pair of the pair of first beams 31a and 31b and the pair of the second beams 32a and 32b move closer to each other, the other pair move away from each other and, when the one pair move closer to each other, the other pair move closer to each other

[First Piezoelectric Detection Unit]

The piezoelectric device 300 further includes a first piezoelectric detector 361 for detecting a vibration of the frame body 330 in the XY-plane. In this embodiment, the first piezoelectric detector 361 is provided in each of the second beams 32a and 32b.

The first piezoelectric detectors 361 are configured in the same manner as the piezoelectric detector 140 (FIG. 3) described in the first embodiment. Each of the first piezoelectric detector 361 has a lamination structure of a pair of electrodes and a piezoelectric layer provided between the pair of electrodes. In this embodiment, each of the first piezoelectric detectors 361 is formed in a strip shape including a long side in the b-axis direction. The first piezoelectric detectors 361 are provided in the second beams 32a and 32b such that film surfaces of the piezoelectric layers are orthogonal to the a-axis direction (FIG. 11).

The first piezoelectric detectors 361 have the same configuration. Each of the first piezoelectric detectors 361 is formed such that a width dimension thereof along the c-axis direction is equal to a thickness dimension of the frame body 330 along the c-axis direction. The first piezoelectric detectors 361 are provided in grooves formed in a front surface of the second beams 32a and 32b along the b-axis direction. The grooves are provided on an inner peripheral side of the frame body 330 with respect to center-of-axis positions of the second beams 32a and 32b.

Each of the first piezoelectric detectors 361 is connected to the self-excited oscillation circuit (not shown). Electrical signals corresponding to amounts of displacement of the second beams 32a and 32b along the a-axis direction are output to the above-mentioned self-excited oscillation circuit. The self-excited oscillation circuit generates, based on the outputs of the first piezoelectric detectors 361, driving signals supplied to the piezoelectric drive units 351 and 352. With this, it is possible to realize a stable self-oscillation of the frame body 330 in the XY-plane.

The piezoelectric device 300 includes first angular velocity detectors 362a, 362b, 362c, and 362d. The first angular velocity detectors 362a to 362d are provided in the connection portions 33a to 33d of the frame body 330, respectively. Each of the first angular velocity detectors 362a to 362d has a shape bent at an almost right angle along an inner edge of the frame body 330. The first angular velocity detectors 362a to 362d are configured to be capable of detecting an angular velocity around the Z-axis that acts on the frame body 330 vibrating in the vibration mode.

Similar to the first piezoelectric detectors 361, each of the first angular velocity detectors 362a to 362d has a lamination structure of a pair of electrodes and a piezoelectric layer provided between the pair of electrodes. In this embodiment, each of the first angular velocity detectors 362a to 362d is formed in a strip shape including long sides in the a-axis direction and the b-axis direction. The first angular velocity detectors 362a to 362d are provided in the connection portions 33a to 33d, respectively, such that film surfaces of the piezoelectric layers are orthogonal to the b-axis direction and the a-axis direction.

The first angular velocity detectors 362a to 362d have the same configuration. Each of the first angular velocity detectors 362a to 362d is formed such that a width dimension thereof along the c-axis direction is equal to a thickness dimension of the frame body 330 along the c-axis direction. The first angular velocity detectors 362a to 362d are provided in grooves formed in a front surface of the connection portions 33a to 33d, respectively. The grooves are provided on an inner peripheral side of the frame body 330 with respect to center-of-axis positions of the first beams 31a and 31b and the second beams 32a and 32b.

Figure 12:
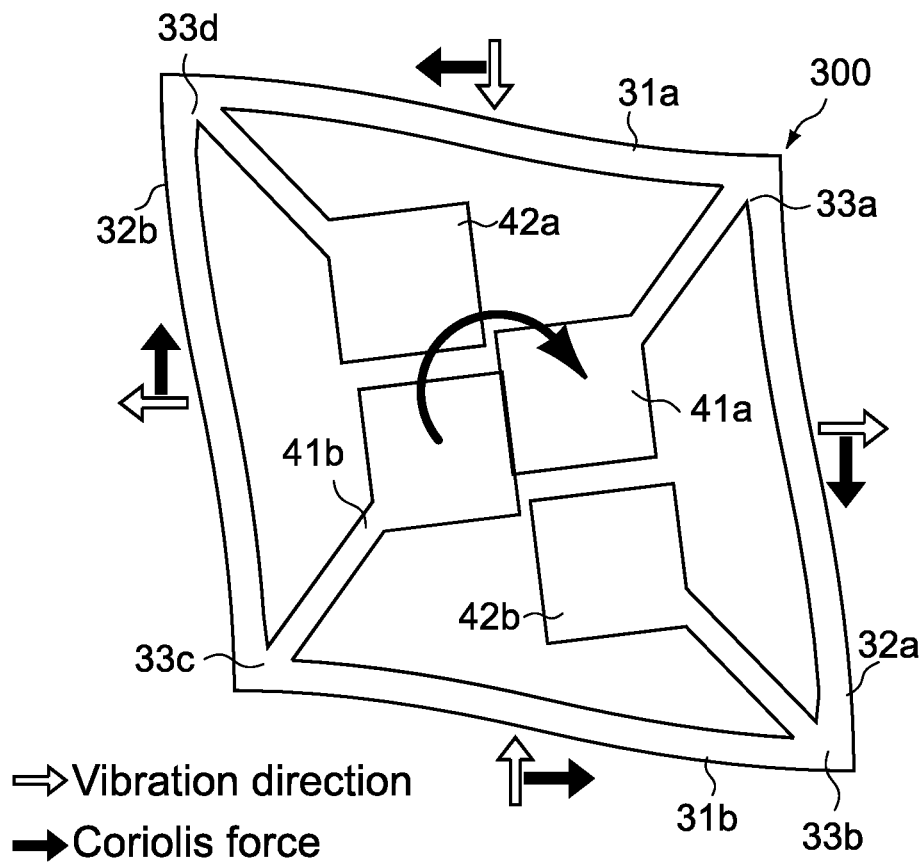
FIG. 12 is a schematic plane view showing a motion example of the piezoelectric device according to the third embodiment.

Each of the first angular velocity detectors 362a to 362d is connected to an angular velocity detection circuit (not shown). The first angular velocity detectors 362a to 362d detect strains of the connection portions 33a to 33d in the XY-plane, respectively. FIG. 12 is a plane view schematically showing a deformation state of the frame body 330 at a certain point of time when the angular velocity around the Z-axis acts on the frame body 330. Note that, for easy understanding, the shape and the deformation state of the frame body 330 is shown somewhat exaggerated.

As shown in FIG. 12, when an clockwise-direction angular velocity about the Z-axis acts on the frame body 330 that performs fundamental vibrations in the above-mentioned vibration mode, a Coriolis force proportional to a magnitude of this angular velocity is, in the XY-plane orthogonal to the Z-axis, generated at each of the points (first beams 31a and 31b and second beams 32a and 32b and first pendulums 41a and 41b and second pendulums 42a and 42b) within the frame body 330, the Coriolis force being in a direction forming 90 degrees in the clockwise direction with a movement direction (vibration direction) of each point at that point of time. Thus, the direction of the Coriolis force depends on the vibration direction of the point on which this Coriolis force acts at this point of time as shown in FIG. 12. As a result, the frame body 330 is squashed (strained) in the XY-plane to be changed from the square shape to an almost parallelogram shape.

Note that FIG. 12 shows a state when a predetermined angular velocity acts in the clockwise direction about the Z-axis. Note that, when the direction of the angular velocity is opposite (counter-clockwise direction), the Coriolis force also acts on the points in the opposite directions.

The first angular velocity detectors 362a to 362d output electrical signals corresponding to amounts and directions of deformation of the connection portions 33a to 33d when the angular velocity is generated, to the above-mentioned angular velocity detection circuit. The angular velocity detection circuit detects, based on the electrical signals of the first angular velocity detectors 362a to 362d, the magnitude and direction of the angular velocity around the Z-axis.

Although each of the first piezoelectric detectors 361 is provided in the second beams 32a and 32b, it is not limited thereto and the first piezoelectric detectors 361 may be provided in only one of the beams. The vibration state of the frame body 330 can be detected also by the first angular velocity detectors 362a to 362d, and hence the functions of the first piezoelectric detectors 361 can also be realized by the first angular velocity detectors 362a to 362d.

[Second Piezoelectric Detection Unit]

The piezoelectric device 300 includes second angular velocity detectors 371a, 371b, 372a, and 372b (second piezoelectric detector). The second angular velocity detectors 371a, 371b, 372a, and 372b are provided in the arms M of the first pendulums 41a and 41b and the second pendulums 42a and 42b, respectively. The second angular velocity detectors 371a, 371b, 372a, and 372b are configured to be capable of detecting angular velocities around the X-axis and the Y-axis that act on the frame body 330 vibrating in the above-mentioned vibration mode.

The second angular velocity detectors 371a, 371b, 372a, and 372b are configured in the same manner as the second piezoelectric detector 141 (FIG. 8) described in the second embodiment. Each of the second angular velocity detectors 371a, 371b, 372a, and 372b has a lamination structure of a pair of electrodes and a piezoelectric layer provided between the pair of electrodes. In this embodiment, each of the second angular velocity detectors 371a, 371b, 372a, and 372b is formed in a strip shape including a long side in the longitudinal direction of each of the arms M. The second angular velocity detectors 371a, 371b, 372a, and 372b are provided in a front surface of the arms M such that film surfaces of the piezoelectric layers are orthogonal to the c-axis direction.

Figure 13A:
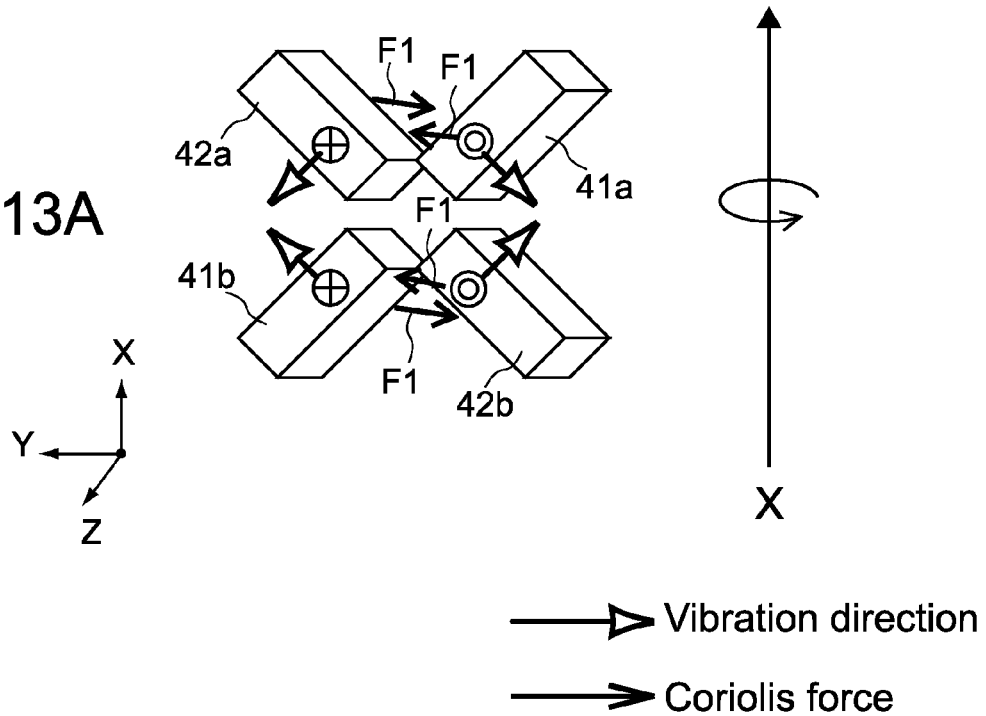
FIGS. 13A and 13B are main-part schematic perspective views explaining another motion example of the piezoelectric device according to the third embodiment.

Each of the first angular velocity detectors 362a to 362d is connected to the above-mentioned angular velocity detection circuit and detects a deformation of the first pendulums 41a and 41b and the second pendulums 42a and 42b along the c-axis direction. FIG. 13A is a schematic perspective view explaining a vibration state of the first pendulums 41a and 41b and the second pendulums 42a and 42b when the angular velocity around the X-axis acts on the frame body 330. On the other hand, FIG. 13B is a schematic perspective view explaining a vibration state of the first pendulums 41a and 41b and the second pendulums 42a and 42b when the angular velocity around the Y-axis acts on the frame body 330.

When the angular velocity around the X-axis acts on the frame body 330 that performs fundamental vibrations in the above-mentioned vibration mode, a Coriolis force F1 in a direction orthogonal to the vibration direction at this point of time is generated in each of the first pendulums 41a and 41b and the second pendulums 42a and 42b as shown in FIG. 13A. With this, one pair of the pendulum 41a and the pendulum 42b adjacent to each other in the X-axis direction are deformed in a positive direction of the Z-axis due to the Coriolis force F1 and amounts of deformation thereof are detected by the second angular velocity detectors 371a and 372b. Further, the other pair of the pendulums 42a and 41b adjacent to each other in the X-axis direction are deformed in a negative direction of the Z-axis due to the Coriolis force F1 and amounts of deformation thereof are detected by the second angular velocity detectors 372a and 371b.

Figure 13B:
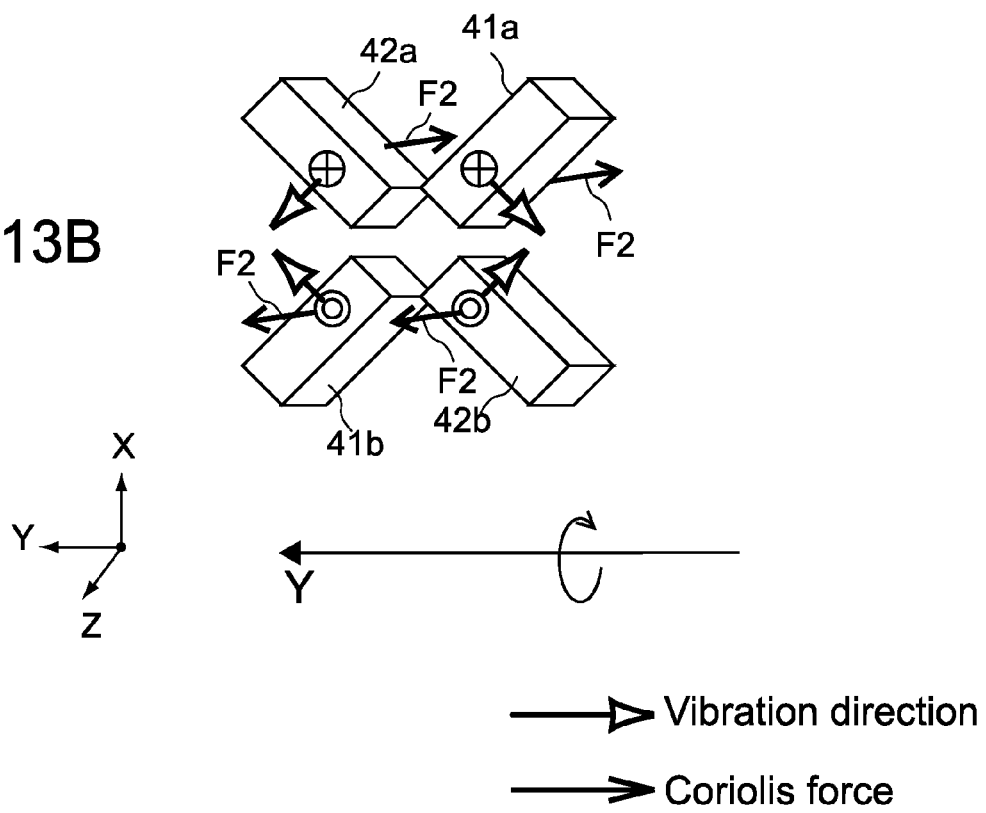

On the other hand, when the angular velocity around the Y-axis acts on the frame body 330 that performs the above-mentioned fundamental vibrations, a Coriolis force F2 in a direction orthogonal to the vibration direction at this point of time is generated in each of the first pendulums 41a and 41b and the second pendulums 42a and 42b as shown in FIG. 13B. With this, one pair of the pendulum 41a and the pendulum 42a adjacent to each other in the Y-axis direction are deformed in the negative direction of the Z-axis due to the Coriolis force F2 and amounts of deformation are detected by the second angular velocity detectors 371a and 372a. Further, the other pair of the pendulums 41b and 42b adjacent to each other in the Y-axis direction are deformed in the positive direction of the Z-axis due to the Coriolis force F2 and amounts of deformation thereof are detected by the second angular velocity detectors 371b and 372b.

Also when an angular velocity is generated around an axis in a direction obliquely intersecting each of the X-axis and the Y-axis, the angular velocity is detected by the same principle as described above. Specifically, each of the first pendulums 41a and 41b and the second pendulums 42a and 42b is deformed due to the Coriolis force corresponding to an X-direction component and a Y-direction component of this angular velocity and amounts of deformation thereof are detected by the second angular velocity detectors 371a, 371b, 372a, and 372b. The angular velocity detection circuit extracts, based on the outputs of the second angular velocity detectors, the angular velocity around the X-axis and the angular velocity around the Y-axis. Thus, an angular velocity around an arbitrary axis parallel to the XY-plane can be detected.

Fourth Embodiment

Figure 14:
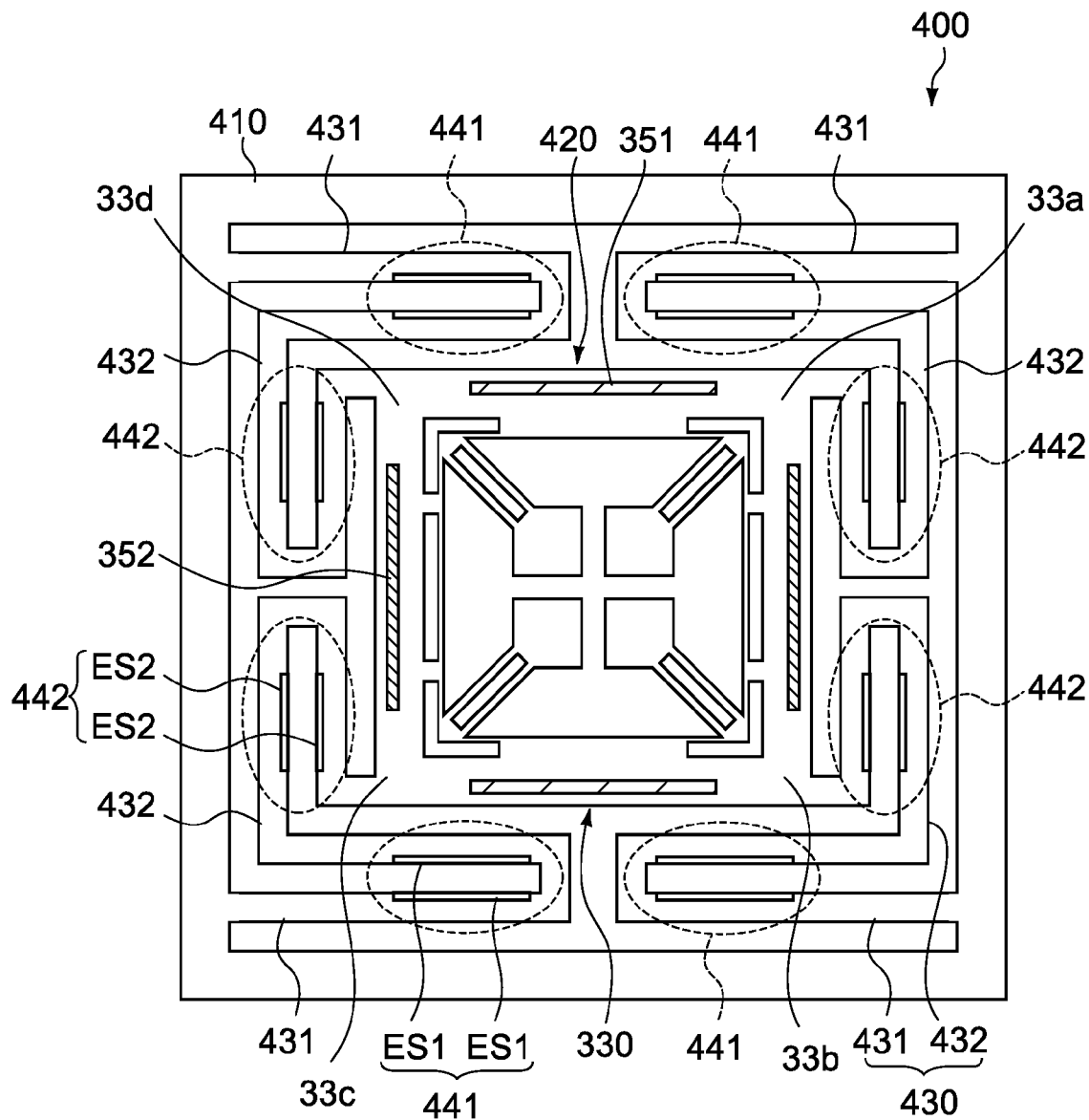
FIG. 14 is a plane view schematically showing a configuration of a piezoelectric device according to a fourth embodiment of the present disclosure.
Figure 15:
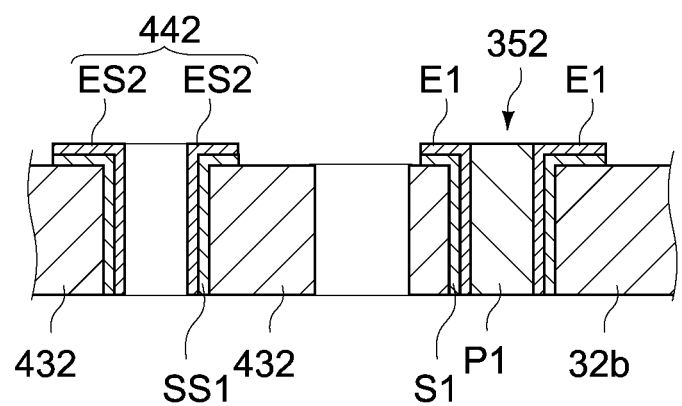
FIG. 15 is a main-part cross-sectional view of the piezoelectric device according to the fourth embodiment.

FIG. 14 is a plane view schematically showing a configuration of a piezoelectric device according to a fourth embodiment of the present disclosure. FIG. 15 is a main-part cross-sectional view thereof.

A piezoelectric device 400 according to this embodiment is configured as a vibration gyro sensor (angular velocity sensor) and an acceleration sensor. The piezoelectric device 400 is applied as, for example, a sensor for shake detection or a sensor for direction detection in an electronic apparatus such as a camera and a car navigation system.

The piezoelectric device 400 includes a vibrator 420, a support portion 410 that supports the vibrator 420, and coupling portions 430 that elastically couple the vibrator 420 and the support portion 410.

The vibrator 420 has the same configuration as the frame body 330 described in the third embodiment. The configurations and functions of the pendulums, the piezoelectric drive units, the piezoelectric detectors, the angular velocity detectors, and the like that are provided in the frame body 330 are the same as those in the above-mentioned third embodiment. Therefore, descriptions thereof will be omitted.

The support portion 410 is formed to surround around the frame body 330 and electrically and mechanically connected to a circuit board (not shown). The support portion 410 is formed integrally with the vibrator 420 together with the coupling portions 430. The support portion 410 is manufactured by, for example, microfabricating a single-crystal silicon substrate that is a non-piezoelectric material.

The coupling portions 430 are provided at four corners (connection portions 33a to 33d) of the frame body 330. Each of the coupling portions 430 includes a plurality of bend portions between the connection portions 33a to 33d and an inner periphery of the support portion 410. The plurality of bend portions include a first bend portion 431 reversing in the Y-axis direction and a second bend portion 432 reversing in the X-axis direction. The first bend portion 431 allows an elastic deformation of the vibrator 420 in the X-axis direction with respect to the support portion 410. The second bend portion 432 allows an elastic deformation of the vibrator 420 in the Y-axis direction with respect to the support portion 410.

The piezoelectric device 400 further includes first acceleration sensors 441 and second acceleration sensors 442. The first acceleration sensors 441 detect an acceleration along the X-axis direction that acts on the vibrator 420. The second acceleration sensors 442 detect an acceleration along the Y-axis direction that acts on the vibrator 420.

Each of the first acceleration sensors 441 is provided in each of the first bend portions 431 and includes one pair of electrode structures ES1 orthogonal to each other in the X-axis direction. Similarly, each of the second acceleration sensors 442 is provided in each of the second bend portions 432 and includes one pair of electrode structures ES2 opposed to each other in the Y-axis direction. These electrode structures ES1 and ES2 are configured to be capable of electrostatically detecting a relative movement of the vibrator 420 in the XY-plane with respect to the support portion 410.

The electrode structures ES1 are provided on two side surfaces of each of the first bend portions 431, the two side surfaces being opposed to each other in the X-axis direction. On the other hand, the electrode structures ES2 are provided on two side surfaces of each of the second bend portions 432, the two side surfaces being opposed to each other in the Y-axis direction. FIG. 15 shows cross-sectional structures of the electrode structures ES2 provided in the second bend portion 432.

The first acceleration sensors 441 and the second acceleration sensors 442 are, for example, formed at the same time as the processes of manufacturing the piezoelectric drive unit and the piezoelectric detector. In this case, for the insulating film S1 formed as a foundation of each of the first acceleration sensors 441 and the second acceleration sensors 442, the same material as the insulating film S1 in the piezoelectric drive units 351 and 352 or the like can be used. For the electrode structures ES1 and ES2, the same metal material as the pair of electrodes E1 in the piezoelectric drive units 351 and 352 or the like can be used. Further, in the process of forming the piezoelectric layer P1 in the piezoelectric drive units 351 and 352 or the like, in order to prevent the piezoelectric material from filling gaps of the electrode structures ES1 and ES2, these gaps only need to be filled with a material in advance that can be removed in a subsequent process, for example, a resist material.

The first acceleration sensors 441 and the second acceleration sensors 442 are connected to an acceleration detection circuit (not shown). The acceleration detection circuit may be incorporated in the above-mentioned angular velocity detection circuit. With the piezoelectric device 400 according to this embodiment, it is possible to detect not only angular velocities around the X-axis, the Y-axis, and the Z-axis but also accelerations along the X-axis and the Y-axis direction can also be detected.

Fifth Embodiment

Next, a fifth embodiment of the present disclosure will be described. In this embodiment, a structure of the piezoelectric drive unit and/or the piezoelectric detector is different from that of the above-mentioned embodiments. Configuration examples of the piezoelectric drive unit and the piezoelectric detector, which will be described hereinafter, are applicable also to the above-mentioned first to fourth embodiments.

First Configuration Example

Figure 16A:
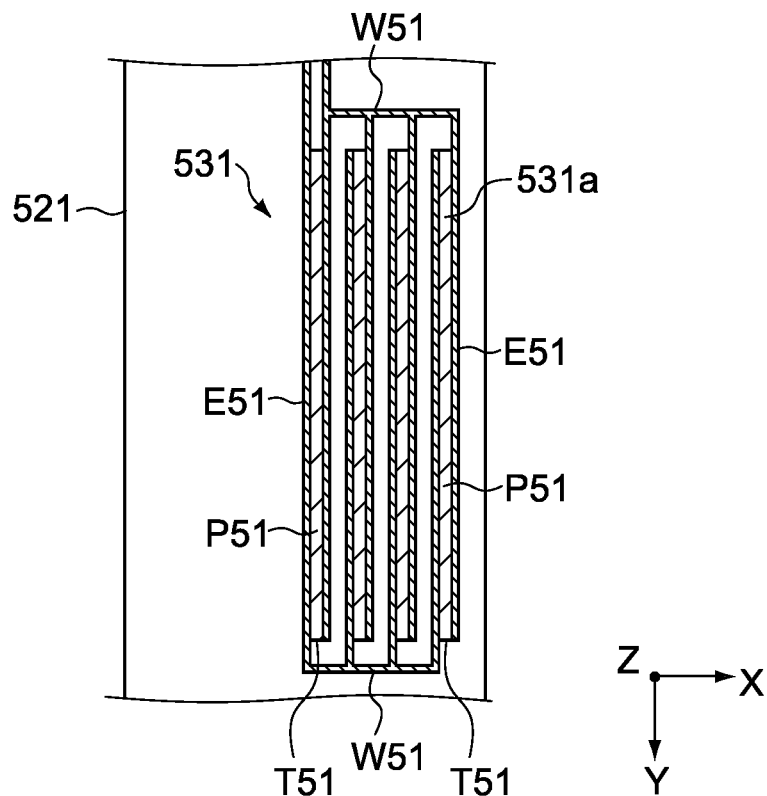
FIGS. 16A to 16C are a main-part plane view showing a configuration of a piezoelectric drive unit in a piezoelectric device according to a fifth embodiment of the present disclosure and equivalent circuit diagrams thereof.
Figure 16B:
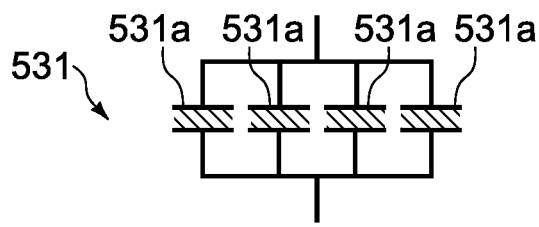

FIG. 16A is a main-part plane view of a vibrator 521 showing a structure of a piezoelectric drive unit 531. FIG. 16B is an equivalent circuit diagram of the piezoelectric drive unit 531. Note that, in FIG. 16A, for easy understanding, the components of the piezoelectric drive unit 531 are hatched.

The piezoelectric drive unit 531 according to this embodiment is constituted of a plurality of (four in this example) piezoelectric elements 531a connected in parallel with one another. Specifically, the piezoelectric drive unit 531 includes a plurality of electrode pairs E51 that are electrically connected in parallel with one another and a plurality of piezoelectric bodies P51 each provided between the electrode pair E51. The vibrator 521 corresponds to the first arm 121 and the second arm 122 in the first and second embodiments and to the first beams 31a and 31b and the second beams 32a and 32b in the third and fourth embodiments.

Each of the piezoelectric elements 531a is constituted of the electrode pair E51 and the piezoelectric body P51. The piezoelectric elements 531a are embedded in a plurality of grooves T51 formed in a front surface of the vibrator 521 to be parallel to one another the Y-axis direction. Each of the piezoelectric bodies P51 is formed of a piezoelectric thin film in a strip shape including a long side in the Y-axis direction and a film surface thereof is orthogonal to the vibration direction (X-axis direction) of the vibrator 521. A wiring W51 for connecting the piezoelectric elements 531a in parallel is formed in a front surface of the vibrator 521.

According to this embodiment, the piezoelectric drive unit 531 is constituted of the plurality of piezoelectric elements 531a connected in parallel, and hence it is possible to double the amount of displacement in comparison with the case where a vibrator is driven by a single piezoelectric element. Thus, in this example, the piezoelectric drive unit 531 is constituted of the four piezoelectric elements 531a, and hence it is possible to quadruple the amount of displacement in comparison with the case where the vibrator is driven by the single piezoelectric element.

Figure 16C:
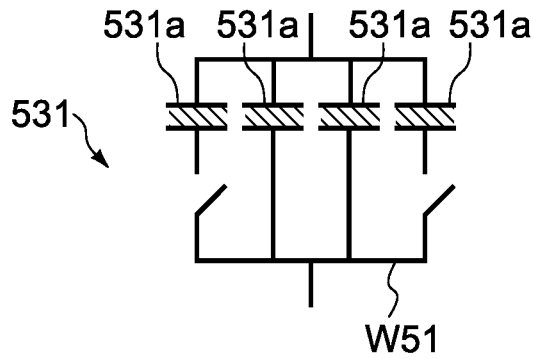

The number of piezoelectric elements 531a is not limited to the above-mentioned example. The number of piezoelectric elements 531a can be increased or reduced depending on the design. Further, according to this embodiment, the substantial number of the piezoelectric elements 531a can be changed to three or fewer by disconnecting the wiring W51 at appropriate positions by a laser beam or the like. An example when the substantial number of the piezoelectric elements 531a is set to two is shown in FIG. 16C.

Further, according to this configuration example, it is possible to discretely change the amount of driving of the piezoelectric drive unit. In addition, it is possible to easily adjust a variation in driving properties in the subsequent process.

In each of the piezoelectric elements 531a, the polarization treatment of the piezoelectric body P52 is performed by applying a polarization voltage to the piezoelectric body P52 via the wiring W51.

Further, the above-mentioned configuration (FIGS. 16A to 16C) is not limited only to the piezoelectric drive unit and may be employed as a configuration of the piezoelectric detector.

Second Configuration Example

Figure 17A:
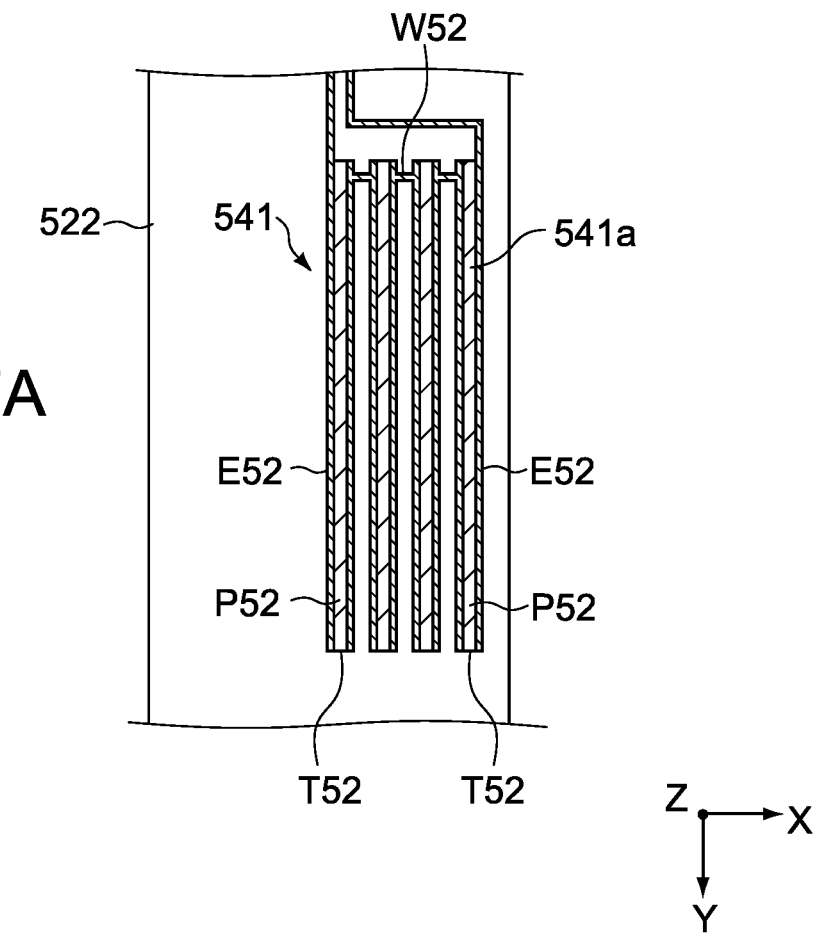
FIGS. 17A and 17B are a main-part plane view showing a configuration of a piezoelectric detector in the piezoelectric device according to the fifth embodiment and an equivalent circuit diagram thereof.
Figure 17B:
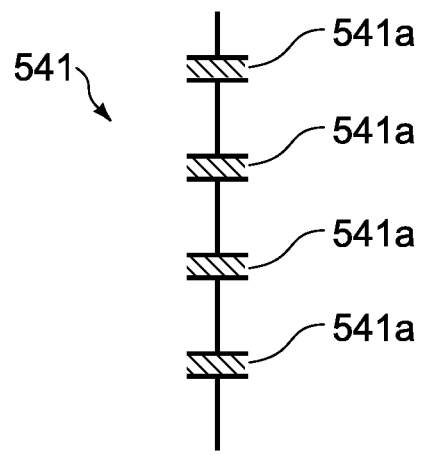

FIG. 17A is a main-part plane view of a vibrator 522 showing a structure of a piezoelectric detector 541. FIG. 17B is an equivalent circuit diagram of the piezoelectric detector 541. Note that, in FIG. 17A, for easy understanding, the components of the piezoelectric detector 541 are hatched.

The piezoelectric detector 541 according to this embodiment is constituted of a plurality of (four in this example) piezoelectric elements 541a connected in series to one another. Specifically, the piezoelectric detector 541 includes a plurality of electrode pairs E52 electrically connected in series to one another and a plurality of piezoelectric bodies P52 each provided between the electrode pair E52. The vibrator 522 corresponds to the first arm 121 and the second arm 122 in the first and second embodiments and to the first beams 31a and 31b and the second beams 32a and 32b in the third and fourth embodiment.

Each of the piezoelectric elements 541a is constituted of the electrode pair E52 and the piezoelectric body P52. The piezoelectric elements 541a are embedded in a plurality of grooves T52 formed in a front surface of the vibrator 522 to be parallel to one another in the Y-axis direction. Each of the piezoelectric bodies P52 is formed of a piezoelectric thin film in a strip shape including a long side in the Y-axis direction and a film surface thereof is orthogonal to the vibration direction (X-axis direction) of the vibrator 522. A wiring W52 for connecting the piezoelectric elements 541a in series is formed in a front surface of the vibrator 522.

According to this embodiment, the piezoelectric detector 541 is constituted of the plurality of piezoelectric elements 541a connected in series, and hence it is possible to double a detection voltage in comparison with the case where the displacement of the vibrator is detected by a single piezoelectric element. Thus, in this example, the piezoelectric detector 541 is constituted of the four piezoelectric elements 541a, and hence it is possible to quadruple the detection voltage in comparison with the case where the displacement of the vibrator is detected by the single piezoelectric element.

Figure 18A:
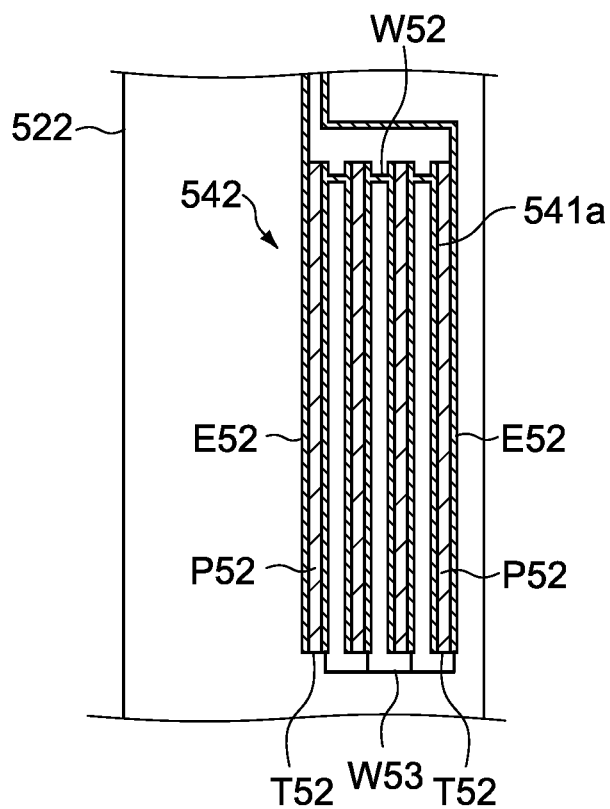
FIGS. 18A and 18B are a main-part plane view showing another configuration of the piezoelectric detector in the piezoelectric device according to the fifth embodiment and an equivalent circuit diagram thereof.
Figure 18B:
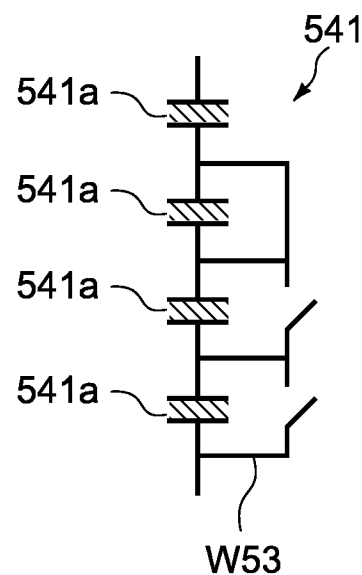

The number of the piezoelectric elements 541a is not limited to the above-mentioned example. The number of the piezoelectric elements 541a can be increased or reduced depending on the design. Further, as shown in FIG. 18A, a wiring W53 for connecting the piezoelectric elements 541a in parallel may be formed in the front surface of the vibrator 522 in advance. In this case, the substantial number of the piezoelectric elements 541a can be changed to three or fewer by disconnecting the wiring W53 at appropriate positions by a laser beam or the like. An example when the substantial number of the piezoelectric elements 541a is set to three is shown in FIG. 18B.

Further, according to this configuration example, it is possible to discretely change the amount of detection by the piezoelectric detector. In addition, it is possible to easily adjust a variation in detection properties in the subsequent process.

FIGS. 19A to 19C show process charts explaining a method of polarizing the piezoelectric detector 541 and equivalent circuits thereof.

After the plurality of piezoelectric elements 541a are formed in the vibrator 522, wirings W52a and W52b for electrically connecting the piezoelectric elements 541a in parallel are formed in the front surface of the vibrator 522 as shown in FIG. 19A. In this state, the polarization treatment of the piezoelectric body P52 of each piezoelectric element 541a is performed. With this, it is possible to perform the polarization treatment at a lower voltage in comparison with the connection in series. Next, as shown in FIG. 19B, the wirings W52a and W52b are selectively removed from the front surface of the vibrator 522. The removal of the wirings W52a and W52b can be, for example, performed by wet etching. In this case, the wirings W52a and W52b are formed of, for example, a metal material having a higher etching selectivity in comparison with the electrodes E52. Finally, as shown in FIG. 19C, the wiring W52 for connecting the piezoelectric elements 541a in series is formed in the front surface of the vibrator 522, and thus the piezoelectric detector 541 shown in FIG. 17A is manufactured.

Third Configuration Example

FIGS. 20A to 20D are main-part cross-sectional views schematically showing some structure examples of the piezoelectric detector.

Figure 20A:
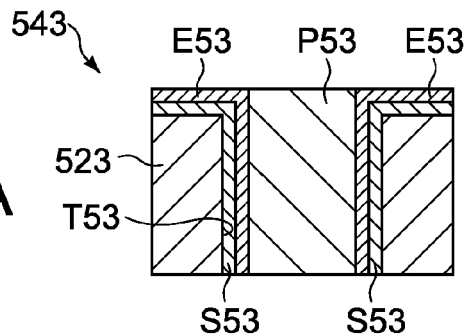
FIGS. 20A to 20D are main-part cross-sectional views showing other configuration examples of the piezoelectric drive unit and the piezoelectric detector.

A piezoelectric detector 543 shown in FIG. 20A has a lamination structure of a pair of electrodes E53 formed via an insulating film S53 on both side surfaces of a groove T53 formed to have a depth extending from a front surface to a back surface of a vibrator 523 and of a piezoelectric body P53 provided between the electrodes E53. The piezoelectric detector 543 has the same structure as that of the piezoelectric detector 140 (FIG. 3) described in the first embodiment.

Figure 20B:
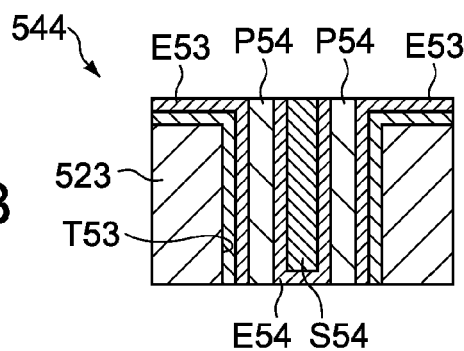
Figure 20C:
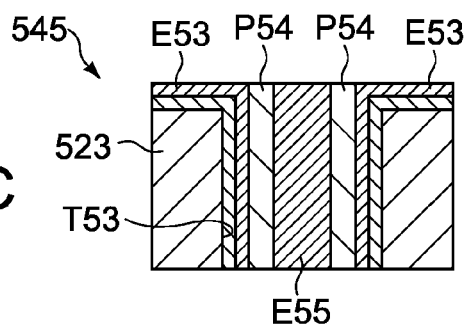
Figure 20D:
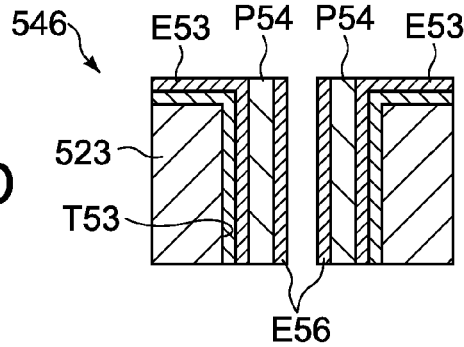

Each of FIGS. 20B to 20D shows an example in which a plurality of piezoelectric elements are formed in a single groove T53. Also with such a configuration, the same actions and effects as those of the above-mentioned second configuration example (FIGS. 17A and 17B) can be obtained.

A piezoelectric detector 544 shown in FIG. 20B includes a plurality of electrode pairs E53 and E54 electrically connected in series to one another and a plurality of piezoelectric bodies P54 each provided between the electrode pairs E53 and E54. The piezoelectric detector 544 includes two piezoelectric elements 544a connected in series to each other in the groove T53.

FIGS. 21A to 21D are process main-part cross-sectional views explaining a method of manufacturing the piezoelectric detector 544. The processes up to a process of forming the electrodes E53 are the same as the processes of forming the pair of electrodes E1 (FIG. 7A) described in the first embodiment.

Figure 21A:
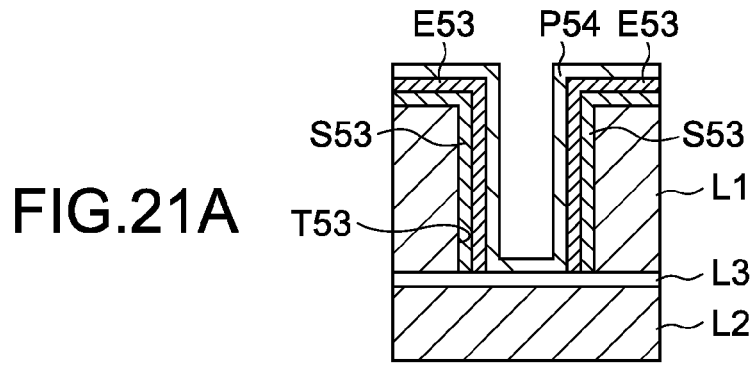
FIGS. 21A to 21D are process cross-sectional views explaining a method of manufacturing a structure shown in FIG. 20B.
Figure 21B:
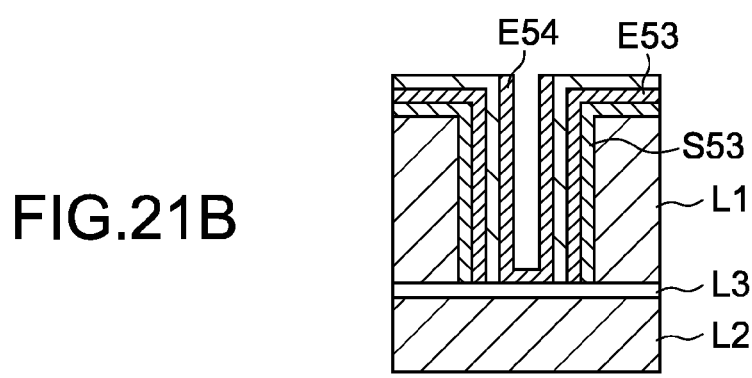
Figure 21C:
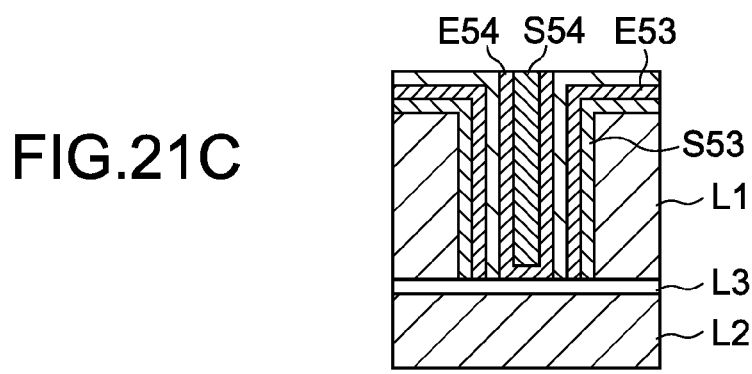
Figure 21D:
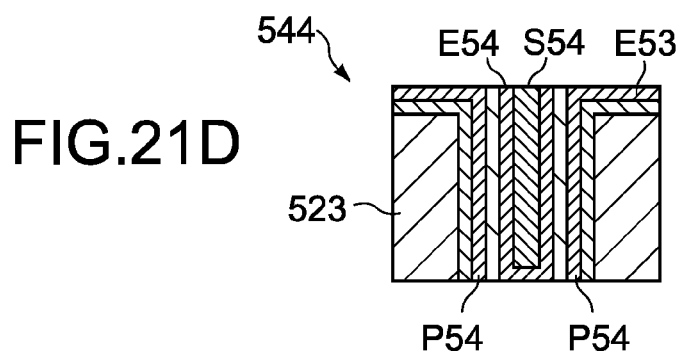

As shown in FIG. 21A, after the formation of the electrodes E53, a piezoelectric thin film forming the piezoelectric bodies P54 is formed. The piezoelectric thin film covers the electrodes E53 in such a manner that the piezoelectric thin film does not fill up the groove T53. Next, as shown in FIG. 21B, after the piezoelectric thin film covering a bottom of the groove T53 is removed, a metal thin film forming the pair of electrodes E54 is formed. The metal thin film covers the piezoelectric bodies P54 in such a manner that the metal thin film does not fill up the groove T53. Subsequently, as shown in FIG. 21C, an insulating material S54 fills the groove T53. Although the insulating material S54 is formed as a protective film of the electrodes E54, the insulating material S54 may be omitted if necessary. Then, as shown in FIG. 21D, after the piezoelectric thin film remaining on a top surface of a substrate L1 is removed by a planarization process, the silicon substrate L2 and the middle layer L3 are removed, and thus the piezoelectric detector 544 is manufactured.

A piezoelectric detector 545 shown in FIG. 20C includes a plurality of electrode pairs E53 and E55 electrically connected in series to one another and the plurality of piezoelectric bodies P54 each provided between the electrode pairs E53 and E55. The piezoelectric detector 545 includes piezoelectric elements 545a connected in series to each other in the groove T53.

Figure 22A:
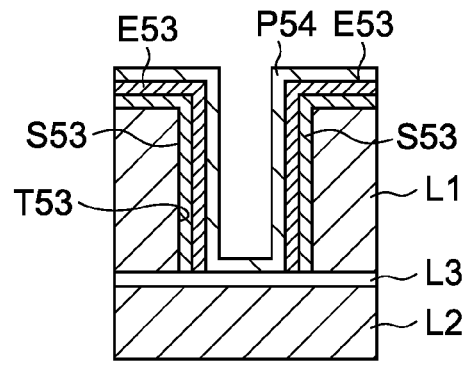
FIGS. 22A to 22D are process cross-sectional views explaining a method of manufacturing a structure shown in FIG. 20C.
Figure 22B:
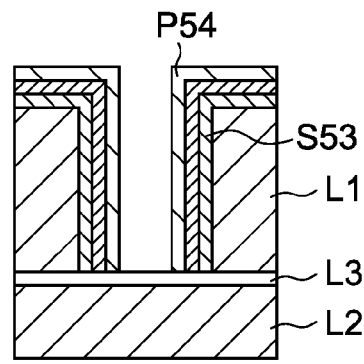
Figure 22C:
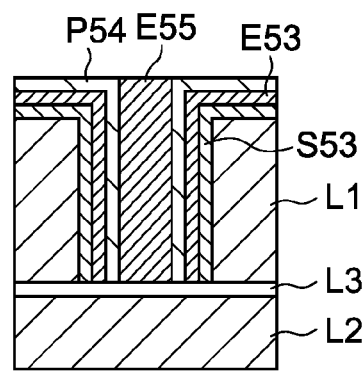
Figure 22D:
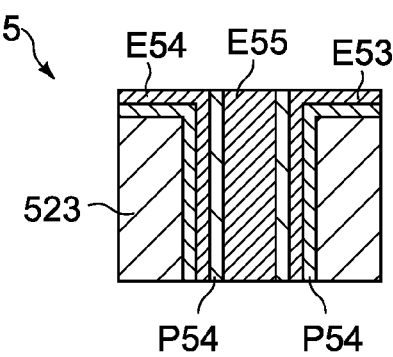

FIGS. 22A to 22D are main-part process cross-sectional views explaining a method of manufacturing the piezoelectric detector 545. The processes up to the formation of the piezoelectric bodies P54 (FIGS. 22A to 22B) are the same as the processes of manufacturing the piezoelectric detector 544, and hence descriptions thereof will be omitted. In this example, the groove T53 is filled with a metal material forming an electrode E55 (FIG. 22C). After that, the same subsequent processes described above are carried out, and thus the piezoelectric detector 545 is manufactured (FIG. 22D).

A piezoelectric detector 546 shown in FIG. 20D includes a plurality of electrode pairs E53 and E56 and a plurality of piezoelectric bodies P54 each provided between the electrode pairs E53 and E56. The piezoelectric detector 545 includes two piezoelectric elements 546a provided in the groove T53 to be opposed to each other. In this example, the piezoelectric elements 546a are not electrically connected to each other and configured to be capable of connecting to each other in parallel to each other. Note that an insulating material may fill between both the piezoelectric elements 546a.

Figure 23A:
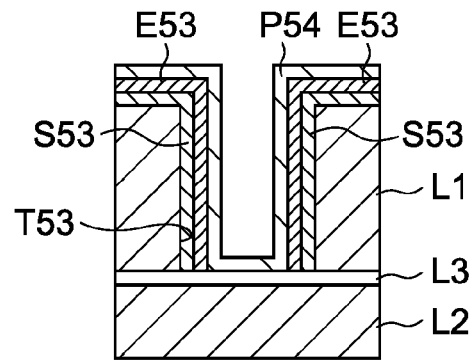
FIGS. 23A to 23D are process cross-sectional views explaining a method of manufacturing a structure shown in FIG. 20D.
Figure 23B:
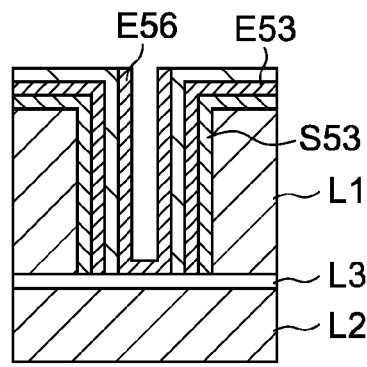
Figure 23C:
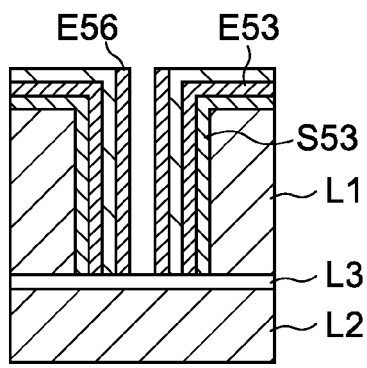
Figure 23D:
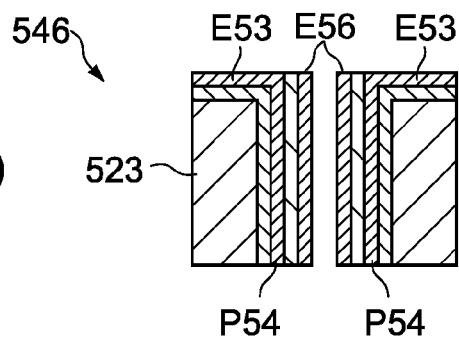

FIGS. 23A to 23D are main-part process cross-sectional views explaining a method of manufacturing the piezoelectric detector 546. The processes up to the formation of the piezoelectric bodies P54 (FIG. 23A) are the same as the processes of manufacturing the piezoelectric detector 544, and hence descriptions thereof will be omitted. In this example, after a metal thin film forming an electrode E56 is formed, the metal thin film covering a bottom of the groove T53 is removed by etching (FIGS. 23B and 23C). After that, the same subsequent processes as described above are carried out, and thus the piezoelectric detector 546 is manufactured (FIG. 23D).

Sixth Embodiment

Figure 24:
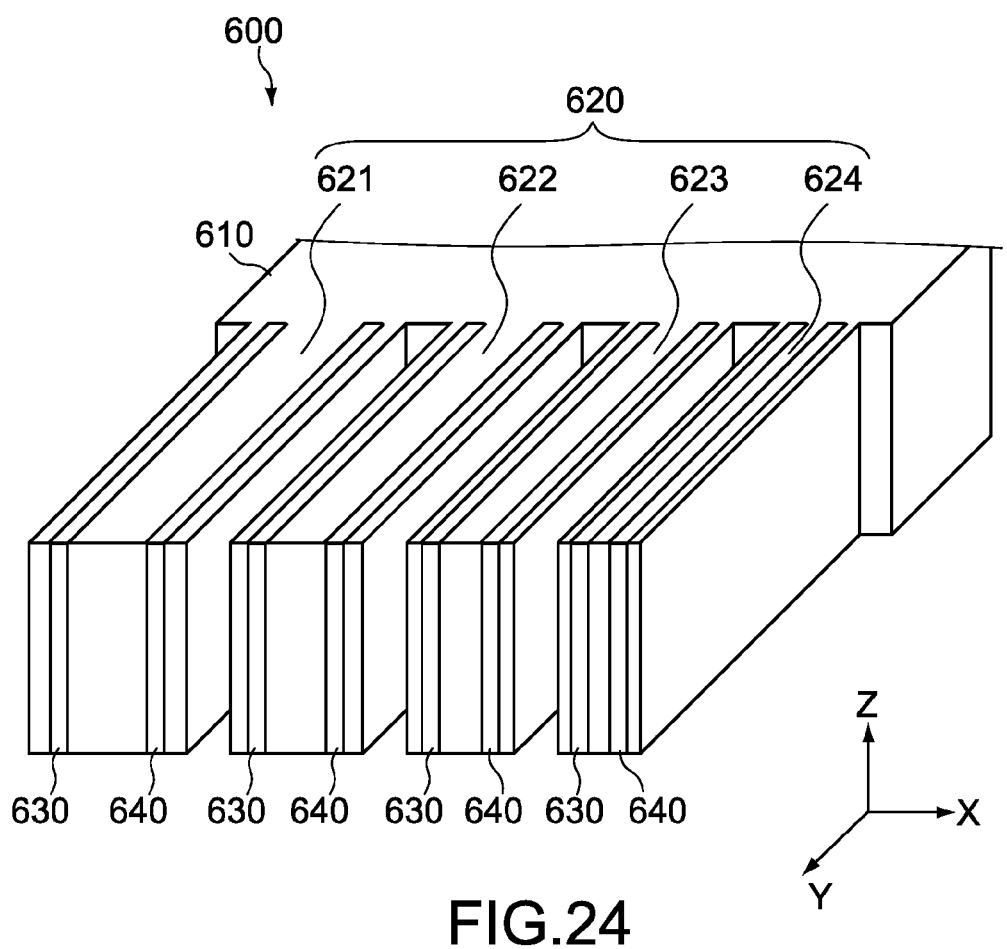
FIG. 24 is a schematic perspective view showing a configuration of a piezoelectric device according to a sixth embodiment of the present disclosure.

FIG. 24 is a schematic perspective view of a piezoelectric device according to a sixth embodiment of the present disclosure. A piezoelectric device 600 according to this embodiment is configured as a band-pass filter. The piezoelectric device 600 is, for example, applied to a filter element in an electronic apparatus such as a cellular phone.

The piezoelectric device 600 according to this embodiment includes a base 610 and a vibrator 620. The vibrator 620 includes a plurality of (four in this example) arms 621, 622, 623, and 624 extending in the Y-axis direction. The arms 621 to 624 are arranged at intervals in the X-axis direction. The arms 621 to 624 are formed such that a length dimension thereof along the Y-axis direction is the same. One ends thereof are fixed to the base 610 to be vibratable and the other ends are set as free ends.

Width dimensions of the arms 621 to 624 along the X-axis direction are different from each other. With this, the arms 621 to 624 are configured to be vibratable at different natural frequencies. Note that not only the width dimension but also a length dimension along the Y-axis direction or a thickness dimension along the Z-axis direction may be made different such that the arms 621 to 624 are configured to have different natural frequencies.

The arms 621 to 624 include a plurality of piezoelectric drive units 630 for oscillating the arms 621 to 624 in the XY-plane.

The plurality of piezoelectric drive units 630 are configured in the same manner as the first piezoelectric element 13a and the second piezoelectric element 13b (FIG. 2) described in the first embodiment. Each of the piezoelectric drive units 630 has a lamination structure of a pair of electrodes and a piezoelectric layer provided between the pair of electrodes. In this embodiment, each of the plurality of piezoelectric drive units 630 is formed in a strip shape including a long side in the Y-axis direction. The plurality of piezoelectric drive units 630 are provided in the arms 621 to 624 such that film surfaces of the piezoelectric layers are orthogonal to the X-axis direction.

The plurality of piezoelectric drive units 630 have the same configuration. Each of the piezoelectric drive units 630 is formed such that a width dimension thereof along the Z-axis direction is equal to a thickness dimension of each of the arms 621 to 624 along the Z-axis direction. The plurality of piezoelectric drive units 630 are provided in grooves formed in a front surface of the arms 621 to 624 along the Z-axis direction. The grooves are provided at positions deviated to one side with respect to center-of-axis positions of the arms 621 to 624.

The arms 621 to 624 further include a plurality of piezoelectric detectors 640 for detecting vibrations of the arms 621 to 624 in the XY-plane.

The plurality of piezoelectric detectors 640 are configured in the same manner as the piezoelectric detector 140 (FIG. 3) described in the first embodiment. Each of the plurality of piezoelectric detectors 640 has a lamination structure of a pair of electrodes and a piezoelectric layer provided between the pair of electrodes. In this embodiment, each of the plurality of piezoelectric detectors 640 is formed in a strip shape including a long side in the Y-axis direction. The plurality of piezoelectric detectors 640 are provided in the arms 621 to 624 such that film surfaces of the piezoelectric layers are orthogonal to the X-axis direction.

The plurality of piezoelectric detectors 640 have the same configuration. Each of the piezoelectric detectors 640 is formed such that a width dimension thereof along the Z-axis direction is the same as a thickness dimension of each of the arms 621 to 624 along the Z-axis direction. The plurality of piezoelectric detectors 640 are provided in grooves formed in the front surface of the arms 621 to 624 along the Z-axis direction. The grooves are provided at positions deviated to an opposite side of the piezoelectric drive units 630 with respect to the center-of-axis positions of the arms 621 to 624.

In the thus configured piezoelectric device 600 according to this embodiment, a common input signal (high-frequency signal) is input into each of the piezoelectric drive units 630 of the arms 621 to 624. The piezoelectric drive unit 630 expands and contracts in the Y-axis direction with the input signal being a driving signal, to thereby excite the corresponding one of the arms 621 to 624. A detection signal corresponding to the displacement of the corresponding one of the arms 621 to 624 is output by the piezoelectric detector 640 for each of the arms 621 to 624.

Figure 25:
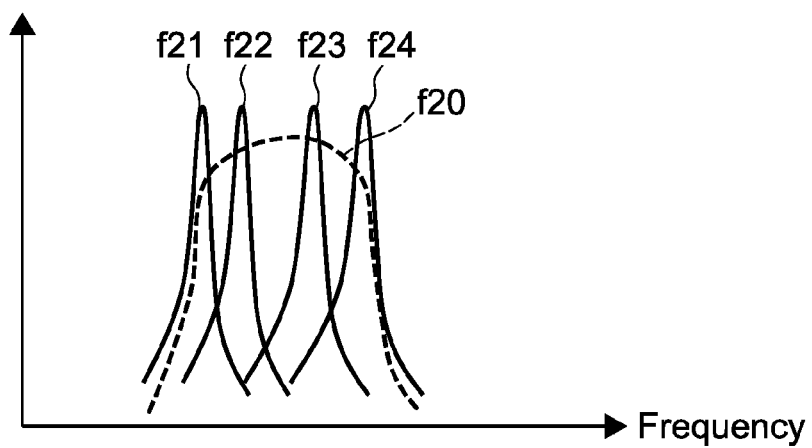
FIG. 25 is a diagram showing an input/output property example of the piezoelectric device of the sixth embodiment.

For example, as shown in FIG. 25, if the driving signal input into each of the piezoelectric drive units 630 is a high-frequency signal having a bandwidth including natural frequencies f21 to f24 of the arms 621 to 624, a synthesized signal depending on a frequency f20 obtained by smoothing the natural frequencies f21 to f24 is output as the detection signals output from the piezoelectric detectors 640. Thus, with the above-mentioned configuration, the piezoelectric device 600 can function as a smoothing filter or a band-pass filter.

Note that, when a structure obtained by simplifying the piezoelectric drive units 630 in the piezoelectric device 600 having the above-mentioned configuration is placed in an acoustic field, a filter element utilizing resonance in vibrations of the air due to a sound source can be configured.

Although the embodiments of the present disclosure have been described above, it is needless to say that the present disclosure is not limited only to the above-mentioned embodiments and may be variously modified without departing from the gist of the present disclosure.

For example, in the above-mentioned first embodiment, the piezoelectric drive units 131 and 132 are provided in the first arm 121 and the second arm 122, respectively. However, the piezoelectric drive units may be provided in only one of the arms. Further, each of the piezoelectric drive units 131 and 132 is constituted of the two piezoelectric elements 13a and 13b. However, each of the piezoelectric drive units 131 and 132 may be constituted of only one of the piezoelectric elements 13a and 13b. Further, in the above-mentioned first and second embodiments, the two arm constitutes the vibrator. However, the number of arms is not limited thereto, one arm or three or more arms may constitute the vibrator.

Figure 26:
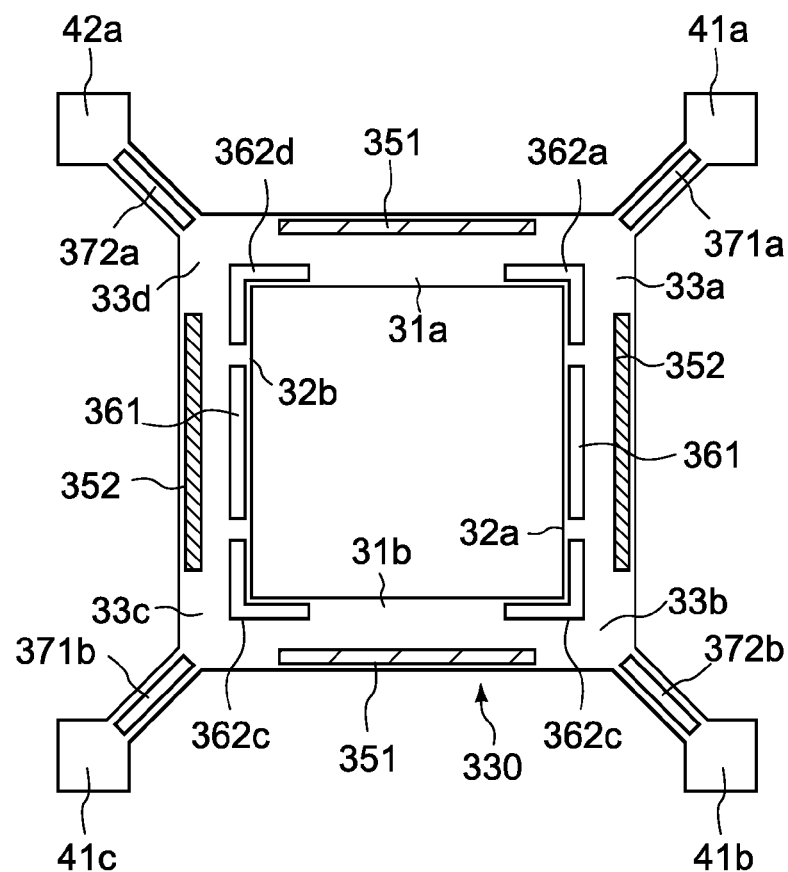
FIG. 26 is a schematic plane view showing a modified example of the configuration of the piezoelectric device according to the third embodiment.

Further, in the above-mentioned third embodiment, the first pendulums 41a and 41b and the second pendulums 42a and 42b of the vibrator 320 are formed to project from the connection portions 33a to 33d inside the frame body 330. However, it is not limited thereto. As shown in FIG. 26, the first pendulums 41a and 41b and the second pendulums 42a and 42b may be formed to project from the connection portions 33a to 33d outside the frame body 330. Further, in the above-mentioned third embodiment, the vibrator 320 includes the frame body 330 and the plurality of pendulums 340. However, the vibrator 320 may be constituted of only the frame body 330.

Figure 27:
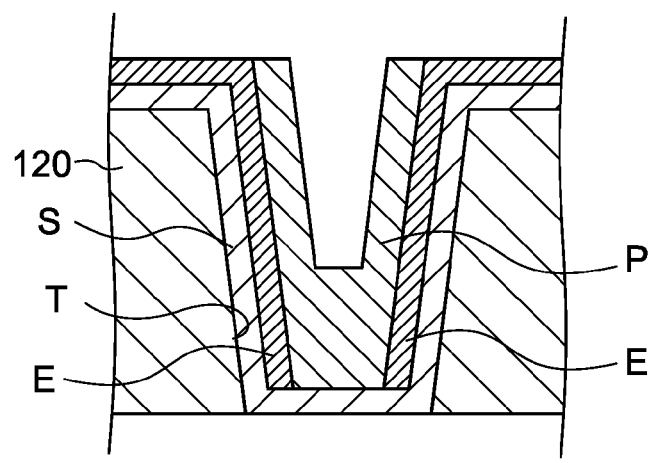
FIG. 27 is a main-part cross-sectional view showing modified examples of structures of the piezoelectric drive unit and the piezoelectric detector.

Further, in each of the above-mentioned embodiments, the groove formed in the front surface of the vibrator, in which the piezoelectric drive unit and the piezoelectric detector are provided, includes the both flat side surfaces orthogonal to the vibration direction. However, it is not limited thereto. For example, as shown in FIG. 27, both side surfaces of a groove T may be formed in a tapered shape. Further, an insulation film S covering the both side surfaces of the groove T and electrodes E may also be formed in a tapered shape. In addition, the piezoelectric body P does not need to fill up the groove T.

Further, the configuration examples of the piezoelectric drive unit and the piezoelectric detector that have been described in the above-mentioned fifth embodiment are not limited to be individually used. The piezoelectric drive unit and the piezoelectric detector may be used at the same time for the common vibrator. Examples thereof will be shown in FIGS. 28A to 28C.

Figure 28:
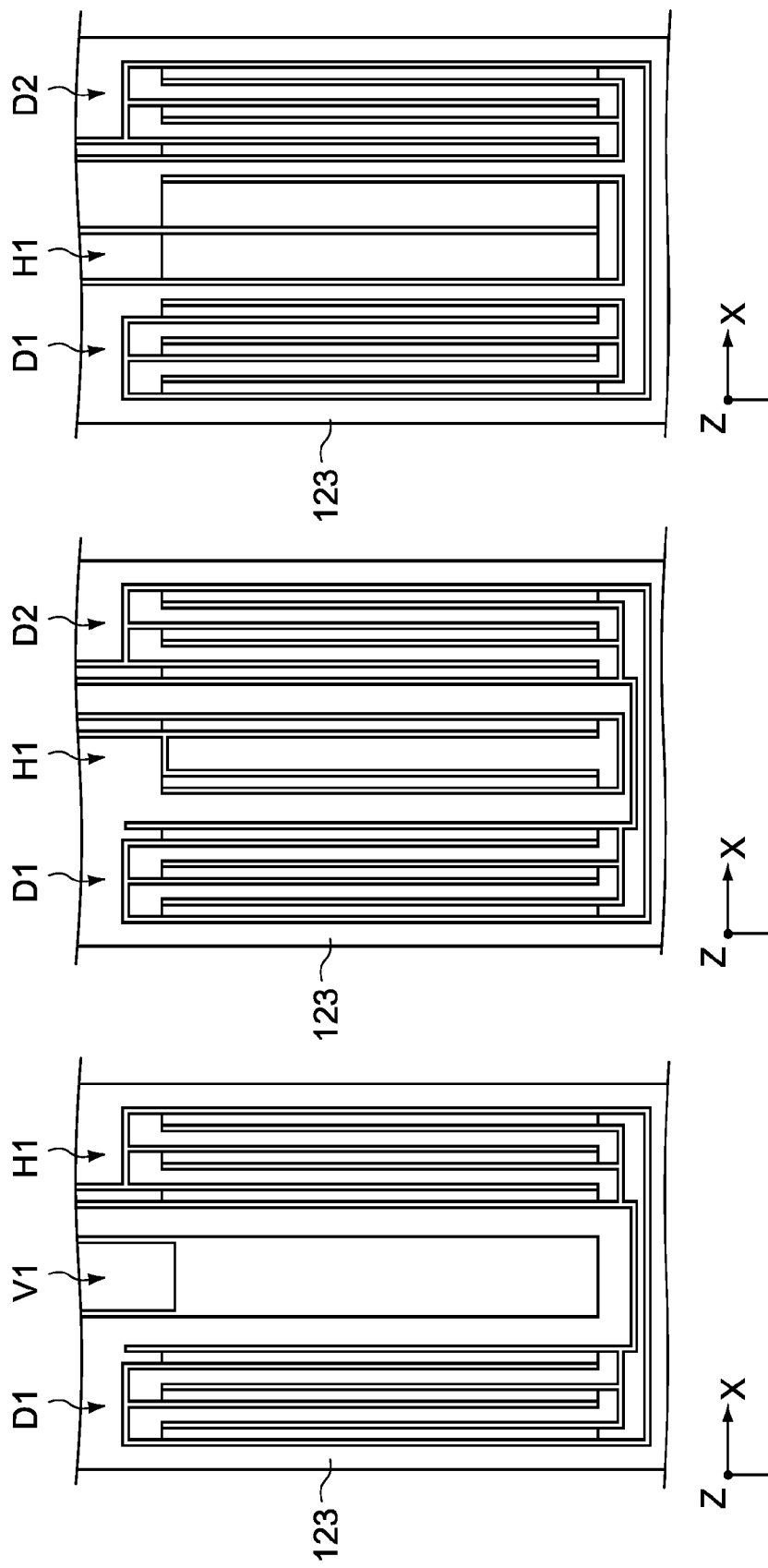
FIGS. 28A to 28C are main-part plane views of a vibrator showing a combination example of the piezoelectric drive unit and the piezoelectric detector according to the fifth embodiment.

A piezoelectric device shown in FIG. 28A includes a piezoelectric drive unit D1 that drives a vibrator 123 in the X-axis direction, a vertical displacement detector V1 that detects a displacement of the vibrator 123 in the Z-axis direction, and a horizontal displacement detector H1 that detects a displacement of the vibrator in the X-axis direction. The piezoelectric drive unit D1 and the horizontal displacement detector H1 are embedded in the vibrator 123 similar to the piezoelectric drive units 131 and 132 and the first piezoelectric detector 140 described in the first embodiment. The vertical displacement detector V1 is provided in the front surface of the vibrator 123 similar to the second piezoelectric detector 141 described in the second embodiment. The vertical displacement detector V1 is provided on a center of an axis of the vibrator 123 extending in the Y-axis direction. The piezoelectric drive unit D1 and the horizontal displacement detector H1 are provided on both sides of the vertical displacement detector V1.

Each of piezoelectric devices shown in FIGS. 28B and 28C includes a horizontal displacement detector H1 provided along a center of an axis of a vibrator 123 and piezoelectric drive units D1 and D2 provided on both sides of the horizontal displacement detector H1. The piezoelectric drive unit D2 is configured in the same manner as the piezoelectric drive unit D1.

Figure 29:
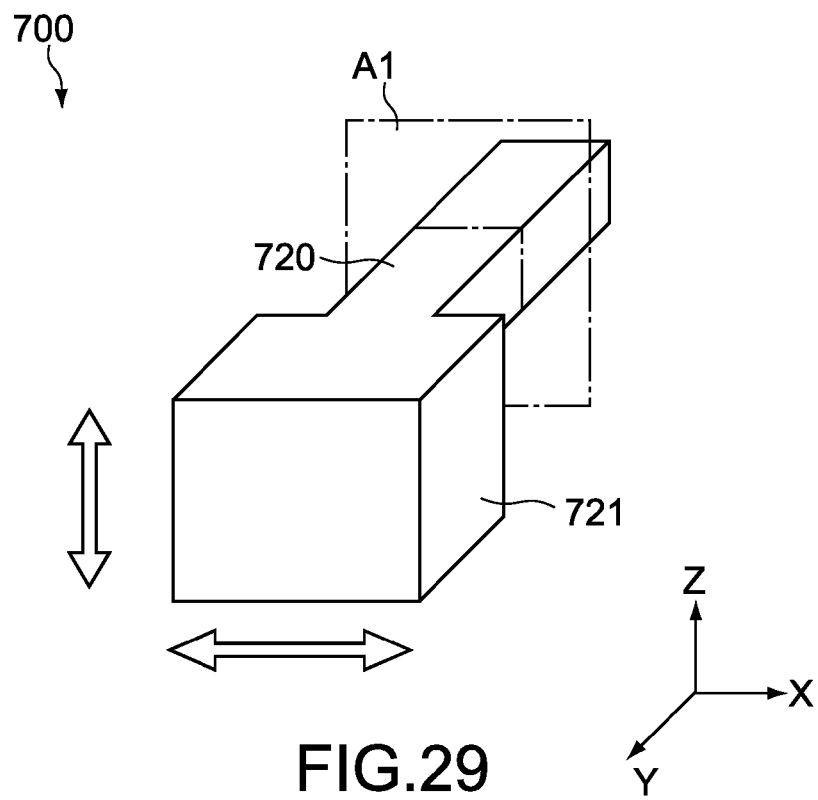
FIG. 29 is a schematic perspective view of a piezoelectric device according to another embodiment of the present disclosure.

In addition, a piezoelectric device according to an embodiment of the present disclosure may also be configured as an energy harvesting element. FIG. 29 is a schematic perspective view thereof.

Figure 30:
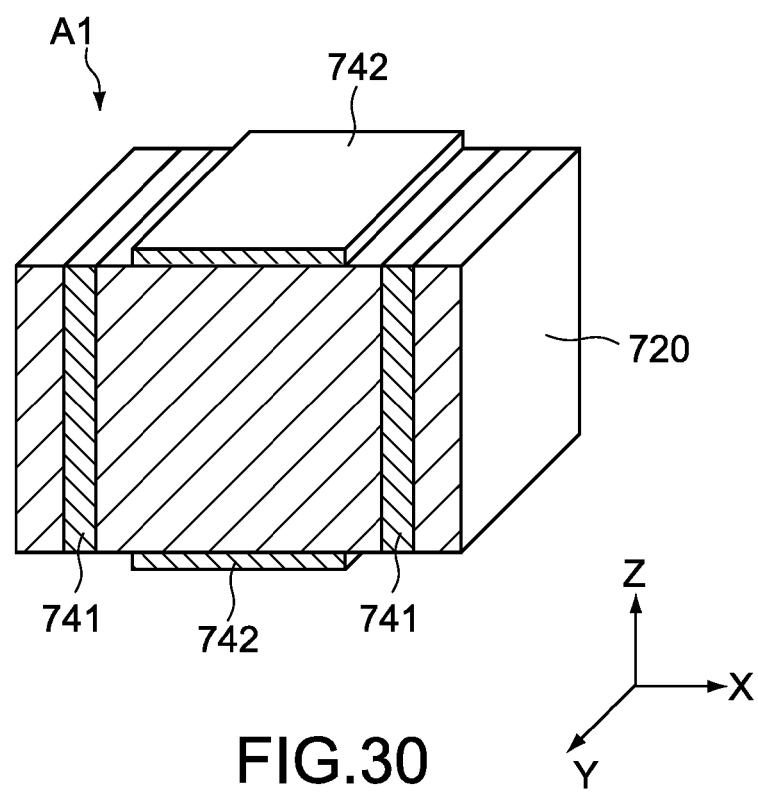
FIG. 30 is an enlarged cross-sectional view of an A1 portion in FIG. 29.

Such a piezoelectric device 700 includes an arm 720 supported on a base to be vibratable and a weight 721 provided on a leading end of the arm 720. FIG. 30 is an enlarged cross-sectional view of an A1 part in FIG. 29. The arm 720 is provided with first piezoelectric detectors 741 for detecting a displacement of the weight 721 in the X-axis direction and second piezoelectric detectors 742 for detecting a displacement of the weight 721 in the Z-axis direction. The first piezoelectric detectors 741 are provided at symmetric positions with respect to a center of an axis of the arm 720. The second piezoelectric detectors 742 are provided on a front surface and a back surface of the arm 720. With this, it is possible to obtain electrical energy from vibration energy of the weight 721 through the first piezoelectric detectors 741 and the second piezoelectric detectors 742.

Note that the present disclosure may also take the following configurations.

(1) A piezoelectric device, including:
a vibrator including
a first surface,
a first groove that is formed along a first axis direction in the first surface, and
a second groove that is formed in the first surface to be parallel to the first groove;
a piezoelectric drive unit including
a first electrode pair that are provided in the first groove and opposed to each other in a second axis direction that is orthogonal to the first axis direction and parallel to the first surface, and
a first piezoelectric body that is provided between the first electrode pair, the piezoelectric drive unit being configured to be capable of vibrating the vibrator in a plane parallel to the first surface due to voltage application between the first electrode pair; and
a first piezoelectric detector including
a second electrode pair that are provided in the second groove and opposed to each other in the second axis direction, and
a second piezoelectric body that is provided between the second electrode pair, the first piezoelectric detector being configured to be capable of detecting a vibration of the vibrator in the plane parallel to the first surface.

(2) The piezoelectric device according to (1), in which
the vibrator further includes
a second surface opposed to the first surface in a third axis direction orthogonal to the first axis direction and the second axis direction, and
the first groove is formed to have a depth extending from the first surface to the second surface and includes both side surface portions covered with the piezoelectric drive unit.

(3) The piezoelectric device according to (1) or (2), in which
the vibrator further includes
a plurality of arms that extend in the first axis direction and are arranged in the second axis direction, and
each of the piezoelectric drive unit and the first piezoelectric detector is provided in at least one arm of the plurality of arms.

(4) The piezoelectric device according to (3), in which
the plurality of arms include
a first arm and a second arm, and
the piezoelectric drive unit is provided in each of the first arm and the second arm and configured to be capable of vibrating the first arm and the second arm in opposite phases in the plane parallel to the first surface.

(5) The piezoelectric device according to any one of (1) to (4), in which
the vibrator further includes
a frame body including
a pair of first beams that extend in the first axis direction and are opposed to each other in the second axis direction,
a pair of second beams that extend in the second axis direction and are opposed to each other in the first axis direction, and
a plurality of connection portions that connect between the first beam and the second beam, and
the piezoelectric drive unit is provided in at least one beam of the first beam and the second beam such that the frame body vibrates in such a vibration mode that, when one pair of the pair of first beams and the pair of second beams move closer to each other, the other pair move away from each other, and, when the one pair move away from each other, the other pair move closer to each other.

(6) The piezoelectric device according to any one of (1) to (5), further including:
a support portion configured to support the vibrator;
a coupling portion configured to elastically couple between the vibrator and the support portion, and
an electrode structure that is provided in the coupling portion and configured to be capable of electrostatically detecting a relative movement of the vibrator with respect to the support portion in the plane parallel to the first surface.

(7) The piezoelectric device according to any one of (1) to (6), further including
a second piezoelectric detector that is provided in the first surface and configured to be capable of detecting a vibration of the vibrator in a plane perpendicular to the first surface.

(8) The piezoelectric device according to (7), in which
the second piezoelectric detector includes
a first electrode layer provided in the first surface,
a second electrode layer that is opposed to the first electrode layer in a direction perpendicular to the first surface, and
a piezoelectric layer provided between the first electrode layer and the second electrode layer.
(9) The piezoelectric device according to any one of (1) to (8), in which
the first groove includes a plurality of grooves arranged in parallel with each other,
the first electrode pair include a plurality of electrode pairs that are provided in the plurality of grooves and electrically connected in parallel with one another, and
the first piezoelectric body includes a plurality of piezoelectric bodies provided between the plurality of electrode pairs.
(10) The piezoelectric device according to any one of (1) to (8), in which
the first electrode pair include a plurality of electrode pairs that are provided in the first groove and electrically connected in parallel with one another, and
the first piezoelectric body includes a plurality of piezoelectric bodies that are provided between the plurality of electrode pairs.
(11) The piezoelectric device according to any one of (1) to (10), in which
the second groove includes a plurality of grooves arranged in parallel with each other,
the second electrode pair include a plurality of electrode pairs that are provided in the plurality of grooves and electrically connected in series to one another, and
the second piezoelectric body includes a plurality of piezoelectric bodies that are provided between the plurality of electrode pairs.
(12) The piezoelectric device according to any one of (1) to (10), in which
the second electrode pair include a plurality of electrode pairs that are provided in the second groove and electrically connected in series to one another, and
the second piezoelectric body includes a plurality of piezoelectric bodies that are provided between the plurality of electrode pairs.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A piezoelectric device, comprising:
a vibrator including
a first surface,
a first groove that is formed along a first axis direction in the first surface, and
a second groove that is formed in the first surface to be parallel to the first groove;
a piezoelectric drive unit including
a first electrode pair that are provided in the first groove and opposed to each other in a second axis direction that is orthogonal to the first axis direction and parallel to the first surface, and
a first piezoelectric body that is provided between the first electrode pair, the piezoelectric drive unit being configured to be capable of vibrating the vibrator in a plane parallel to the first surface due to voltage application between the first electrode pair; and
a first piezoelectric detector including
a second electrode pair that are provided in the second groove and opposed to each other in the second axis direction, and
a second piezoelectric body that is provided between the second electrode pair, the first piezoelectric detector being configured to be capable of detecting a vibration of the vibrator in the plane parallel to the first surface.

2. The piezoelectric device according to claim 1, wherein the vibrator further includes
a second surface opposed to the first surface in a third axis direction orthogonal to the first axis direction and the second axis direction, and
the first groove is formed to have a depth extending from the first surface to the second surface and includes both side surface portions covered with the piezoelectric drive unit.

3. The piezoelectric device according to claim 1, wherein the vibrator further includes
a plurality of arms that extend in the first axis direction and are arranged in the second axis direction, and
each of the piezoelectric drive unit and the first piezoelectric detector is provided in at least one arm of the plurality of arms.

4. The piezoelectric device according to claim 3, wherein the plurality of arms include
a first arm and a second arm, and
the piezoelectric drive unit is provided in each of the first arm and the second arm and configured to be capable of vibrating the first arm and the second arm in opposite phases in the plane parallel to the first surface.

5. The piezoelectric device according to claim 1, wherein the vibrator further includes
a frame body including
a pair of first beams that extend in the first axis direction and are opposed to each other in the second axis direction,
a pair of second beams that extend in the second axis direction and are opposed to each other in the first axis direction, and
a plurality of connection portions that connect between the first beam and the second beam, and
the piezoelectric drive unit is provided in at least one beam of the first beam and the second beam such that the frame body vibrates in such a vibration mode that, when one pair of the pair of first beams and the pair of second beams move closer to each other, the other pair move away from each other, and, when the one pair move away from each other, the other pair move closer to each other.

6. The piezoelectric device according to claim 1, further comprising:
a support portion configured to support the vibrator;
a coupling portion configured to elastically couple between the vibrator and the support portion, and
an electrode structure that is provided in the coupling portion and configured to be capable of electrostatically detecting a relative movement of the vibrator with respect to the support portion in the plane parallel to the first surface.

7. The piezoelectric device according to claim 1, further comprising a second piezoelectric detector that is provided in the first surface and configured to be capable of detecting a vibration of the vibrator in a plane perpendicular to the first surface.

8. The piezoelectric device according to claim 7, wherein the second piezoelectric detector includes
   a first electrode layer provided in the first surface,
   a second electrode layer that is opposed to the first electrode layer in a direction perpendicular to the first surface, and
   a piezoelectric layer provided between the first electrode layer and the second electrode layer.

9. The piezoelectric device according to claim 1, wherein the first groove includes a plurality of grooves arranged in parallel with each other,
   the first electrode pair include a plurality of electrode pairs that are provided in the plurality of grooves and electrically connected in parallel with one another, and
   the first piezoelectric body includes a plurality of piezoelectric bodies provided between the plurality of electrode pairs.

10. The piezoelectric device according to claim 1, wherein the first electrode pair include a plurality of electrode pairs that are provided in the first groove and electrically connected in parallel with one another, and
    the first piezoelectric body includes a plurality of piezoelectric bodies that are provided between the plurality of electrode pairs.

11. The piezoelectric device according to claim 1, wherein the second groove includes a plurality of grooves arranged in parallel with each other,
    the second electrode pair include a plurality of electrode pairs that are provided in the plurality of grooves and electrically connected in series to one another, and
    the second piezoelectric body includes a plurality of piezoelectric bodies that are provided between the plurality of electrode pairs.

12. The piezoelectric device according to claim 1, wherein the second electrode pair include a plurality of electrode pairs that are provided in the second groove and electrically connected in series to one another, and
    the second piezoelectric body includes a plurality of piezoelectric bodies that are provided between the plurality of electrode pairs.

13. An electronic apparatus, comprising
    a piezoelectric device including
        a vibrator including
            a first surface,
            a first groove that is formed along a first axis direction in the first surface, and
            a second groove that is formed in the first surface to be parallel to the first groove,
        a piezoelectric drive unit including
            a first electrode pair that are provided in the first groove and opposed to each other in a second axis direction that is orthogonal to the first axis direction and parallel to the first surface, and
            a first piezoelectric body that is provided between the first electrode pair, the piezoelectric drive unit being configured to be capable of vibrating the vibrator in a plane parallel to the first surface due to voltage application between the first electrode pair, and
        a first piezoelectric detector including
            a second electrode pair that are provided in the second groove and opposed to each other in the second axis direction, and
            a second piezoelectric body that is provided in the second electrode pair, the first piezoelectric detector being configured to be capable of detecting a vibration of the vibrator in the plane parallel to the first surface.

* * * * *